United States Patent
Watanabe

(10) Patent No.: US 8,926,120 B2
(45) Date of Patent: Jan. 6, 2015

(54) LED LAMP AND MANUFACTURING METHOD THEREOF

(75) Inventor: Toshio Watanabe, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 213 days.

(21) Appl. No.: 13/353,140

(22) Filed: Jan. 18, 2012

(65) Prior Publication Data
US 2012/0182728 A1     Jul. 19, 2012

(30) Foreign Application Priority Data

Jan. 18, 2011    (JP) ................................ 2011-007596
Jan. 18, 2011    (JP) ................................ 2011-007597

(51) Int. Cl.

| | |
|---|---|
| F21V 7/20 | (2006.01) |
| F21V 29/00 | (2006.01) |
| F21V 1/00 | (2006.01) |
| F21K 99/00 | (2010.01) |
| F21Y 101/02 | (2006.01) |

(52) U.S. Cl.
CPC . *F21K 9/175* (2013.01); *F21K 9/90* (2013.01); *F21Y 2101/02* (2013.01)
USPC ..................................... 362/218; 362/217.02

(58) Field of Classification Search
CPC .............. F21K 9/175; F21Y 2103/003; F21Y 2105/001; F21Y 2111/005; F21Y 2103/00; F21V 29/004; F21V 29/2206; F21V 3/005; F21V 29/22; F21V 29/24
USPC ............................................. 362/217.02, 218
See application file for complete search history.

(56) References Cited

U.S. PATENT DOCUMENTS

2009/0290334 A1* 11/2009 Ivey et al. ..................... 362/219

FOREIGN PATENT DOCUMENTS

JP              6-54103          7/1994

* cited by examiner

*Primary Examiner* — Anh Mai
*Assistant Examiner* — Zachary J Snyder
(74) *Attorney, Agent, or Firm* — Hamre, Schumann, Mueller & Larson, P.C.

(57) ABSTRACT

A LED (Light Emitting Diode) lamp capable of effectively dissipating heat to the outside and distinguishing borders of bright portions and dark portions in a tube cap is provided. The LED lamp includes: a tube; a support member, including a heat dissipation component extending in an axial direction of the tube, and accommodated in the tube; a plurality of LED chips, accommodated in the tube and supported by the support member; and an adhesive layer, disposed between the heat dissipation component and the tube, and used for adhering the heat dissipation component and the tube. The LED lamp further includes a tube cap formed by a first semi-cylinder portion and a second semi-cylinder portion. A light passing space allowing light emitted from each LED chip to pass through is formed in the tube. The first semi-cylinder portion and the second semi-cylinder portion together surround the tube.

40 Claims, 30 Drawing Sheets

LED LAMP AND MANUFACTURING METHOD THEREOF

BACKGROUND OF THE INVENTION

1. Field of the Invention

The invention relates to a LED (Light Emitting Diode) lamp and a manufacturing method thereof.

2. Description of the Related Art

FIG. 32 is a cross-sectional view of an example of a conventional LED lamp. Referring to FIG. 32, the LED lamp 900 includes a substrate 91, a plurality of LED modules 92, a heat dissipation component 95, a tube 93, caps 961 and 962, and a terminal 94. Each LED module 92 is loaded on the substrate 91. The substrate 91 is mounted on the heat dissipation component 95. The tube 93 is cylindrical, and accommodates the substrate 91, the LED modules 92, and the heat dissipation component 95. The caps 961 and 962 each block an opening of the tube 93. The terminal 94 is embedded in an insertion slot of a socket for a straight-tube type fluorescent lamp. A wiring pattern (not shown in the drawings) of the LED modules 92 connected to the terminal 94 is formed on the substrate 91. For the LED lamp, reference can be made to Patent Document 1.

When the LED lamp 900 is used, the LED modules 92 generate heat. The heat is transferred through the substrate 91 to the heat dissipation component 95, and then dissipated from the heat dissipation component 95 to an inner space of the tube 93. Thereby, heat is accumulated in the inner space of the tube 93, which may cause excessively high temperature in the space.

The caps 961 and 962 may include resin. When the resin is, for example, white, light easily passes through the caps 961 and 962. Therefore, when the LED lamp 900 is used, the cap 961 may gradually turn dark from the right side of the figure to the left side, which is rarely seen in the conventional straight-tube type fluorescent lamp. As a result, when the LED lamp 900 is used to replace the conventional straight-tube type fluorescent lamp, some users may feel uncomfortable.

Patent Document 1: Japanese Patent Publication No. 6-54103

SUMMARY OF THE INVENTION

In view of the above, the invention provides an LED lamp capable of effectively dissipating heat to the outside and distinguishing borders of bright portions and dark portions in a cap.

A first embodiment of the invention provides an LED lamp, which includes: a tube; a support member, including a heat dissipation component extending in an axial direction of the tube and accommodated in the tube; a plurality of LED chips, accommodated in the tube and supported by the support member; and an adhesive layer, disposed between the heat dissipation component and the tube, and used for adhering the heat dissipation component and the tube.

In a preferred embodiment of the invention, the tube includes a material having a linear expansion coefficient greater than that of the material for forming the heat dissipation component.

In a preferred embodiment of the invention, the LED chips, the heat dissipation component, and the adhesive layer are together accommodated in any of two spaces divided by a virtual plane of an axis of the tube in a space surrounded and defined by the tube.

In a preferred embodiment of the invention, the adhesive layer is in a shape extending along the axial direction.

In a preferred embodiment of the invention, the heat dissipation component has a first groove formed thereon and extending along the axial direction; and the adhesive layer is formed on the first groove.

In a preferred embodiment of the invention, the heat dissipation component includes a first outer surface along a peripheral direction and the axial direction of the tube; and the adhesive layer has contact with the first outer surface, and the first groove is recessed from the first outer surface.

In a preferred embodiment of the invention, the heat dissipation component has a second groove formed thereon, which is recessed from the first outer surface and extends along the axial direction, the first groove is spaced apart from the second groove on the peripheral direction of the tube, and the adhesive layer is formed on the second groove.

In a preferred embodiment of the invention, the heat dissipation component includes a second outer surface connected to the second groove, and the second outer surface s is located on an opposite side of the first outer surface relative to the second groove and is entirely exposed to the adhesive layer.

In a preferred embodiment of the invention, the heat dissipation component includes a groove surface that defines the first groove; and the groove surface includes a portion spaced apart from the adhesive layer with an interval.

In a preferred embodiment of the invention, the heat dissipation component has a hollow portion formed thereon and extending in the axial direction.

In a preferred embodiment of the invention, the hollow portion has an opening formed in the axial direction.

In a preferred embodiment of the invention, a cross-section of a surface of the hollow portion orthogonal to the axial direction is rectangular, and when observed from the axial direction, the hollow portion is in a shape extending from an axis of the tube towards the adhesive layer.

In a preferred embodiment of the invention, the adhesive layer includes a resin portion and a filler mixed into the resin portion, and the filler includes a material having a thermal conductivity greater than that of the material for forming the resin portion.

In a preferred embodiment of the invention, the resin portion includes silicone based materials.

In a preferred embodiment of the invention, the tube includes an outer-cylinder portion having a circular cross-section and a protruding portion protruded from the outer-cylinder portion; and the protruding portion is embedded in the first groove, and the adhesive layer is disposed between the protruding portion and the first groove.

In a preferred embodiment of the invention, the protruding portion includes a plurality of strip slices disposed at intervals along the axial direction.

In a preferred embodiment of the invention, the LED lamp further includes a cap having a first semi-cylinder portion and a second semi-cylinder portion. The tube has a light passing space formed thereon and allowing light emitted from each LED chip to pass through. The first semi-cylinder portion and the second semi-cylinder portion together surround the tube. The cap includes a first shielding wall standing upright from the first semi-cylinder portion towards an axis of the tube when observed from the axial direction of the tube. The first shielding wall faces the light passing space and overlaps with the support member in the axial direction.

In a preferred embodiment of the invention, the first semi-cylinder portion to includes a first end portion located at one end on the peripheral direction of the tube, the second semi-cylinder portion includes a second end portion located at one end on the peripheral direction, and the first end portion and the second end portion face each other.

In a preferred embodiment of the invention, the cap includes a second shielding wall facing the light passing space and overlapping with the first end portion and the second end portion on the peripheral direction.

In a preferred embodiment of the invention, the cap includes a third semi-cylinder portion connected to the first semi-cylinder portion and a fourth semi-cylinder portion connected to the second semi-cylinder portion. Th e third semi-cylinder portion includes a third end portion located at one end on the peripheral direction, the fourth semi-cylinder portion includes a fourth end portion located at one end on the peripheral direction, and the third end portion and the fourth end portion face each other.

In a preferred embodiment of the invention, the cap includes a first protruding portion connected to the third semi-cylinder portion and protruded from the third semi-cylinder portion towards the support member; and the support member is clamped by the first protruding portion and the fourth semi-cylinder portion.

In a preferred embodiment of the invention, the cap includes a second protruding portion connected to the fourth semi-cylinder portion and protruded from the fourth semi-cylinder portion towards the support member. A through hole is formed on the support member, the first protruding portion has a first hole formed thereon and opened towards the through hole, and the second protruding portion has a second hole formed thereon and opened towards the first hole.

In a preferred embodiment of the invention, the second protruding portion is embedded in the through hole.

In a preferred embodiment of the invention, the cap includes an abutting portion abutting on the support member, and the abutting portion is spaced apart from the first protruding portion in a direction from the first shielding wall towards any of the LED chips along the axial direction of the tube.

In a preferred embodiment of the invention, the cap includes a third shielding wall overlapping with the third end portion and the fourth end portion on the peripheral direction. A thickness of the third semi-cylinder portion and a thickness of the fourth semi-cylinder portion are both greater than any of the first semi-cylinder portion and the second semi-cylinder portion, and the third shielding wall overlaps with any of the third semi-cylinder portion and the fourth semi-cylinder portion in a diameter direction of the tube.

In a preferred embodiment of the invention, a thickness of the third semi-cylinder portion and a thickness of the fourth semi-cylinder portion are both greater than any of the first semi-cylinder portion and the second semi-cylinder portion, and the fourth semi-cylinder portion has a notch formed thereon and the support member is embedded in the notch.

In a preferred embodiment of the invention, the LED lamp further includes a circuit part accommodated in the cap. The circuit part includes a diode bridge having two input terminals and two output terminals and a resistor electrically disposed between the input terminals, and the LED chips are electrically disposed between the output terminals.

In a preferred embodiment of the invention, the circuit part includes an alternating current/direct current (AC/DC) converter for converting an input commercial AC voltage into a DC voltage.

A second embodiment of the invention provides an LED lamp, which includes: a plurality of LED chips; a support member, for supporting the LED chips; a tube, for accommodating the LED chips and the support member, and having a light passing space formed thereon and allowed light emitted from each LED chip to pass through; and a cap, including a first semi-cylinder portion and a second semi-cylinder portion. The first semi-cylinder portion and the second semi-cylinder portion together surround the tube. The cap includes a first shielding wall standing upright from the first semi-cylinder portion towards an axis of the tube when observed from an axial direction of the tube. The first shielding wall faces the light passing space and overlaps with the support member in the axial direction.

In a preferred embodiment of the invention, the first semi-cylinder portion includes a first end portion located at one end on a peripheral direction of the tube, the second semi-cylinder portion includes a second end portion located at one end on the peripheral direction, and the first end portion and the second end portion face each other.

In a preferred embodiment of the invention, the cap includes a second shielding wall facing the light passing space and overlapping with the first end portion and the second end portion on the peripheral direction.

In a preferred embodiment of the invention, the cap includes a third semi-cylinder portion connected to the first semi-cylinder portion and a fourth semi-cylinder portion connected to the second semi-cylinder portion. The third semi-cylinder portion includes a third end portion located at one end on a peripheral direction, the fourth semi-cylinder portion includes a fourth end portion located at one end on the peripheral direction, and the third end portion and the fourth end portion face each other.

In a preferred embodiment of the invention, the cap includes a first protruding portion connected to the third semi-cylinder portion and protruded from the third semi-cylinder portion towards the support member; and the support member is clamped by the first protruding portion and the fourth semi-cylinder portion.

In a preferred embodiment of the invention, the cap includes a second protruding portion connected to the fourth semi-cylinder portion and protruded from the fourth semi-cylinder portion towards the support member. A through hole is formed on the support member, the first protruding portion has a first hole formed thereon and opened towards the through hole, and the second protruding portion has a second hole formed thereon and opened towards the first hole.

In a preferred embodiment of the invention, the second protruding portion is embedded in the through hole.

In a preferred embodiment of the invention, the cap includes an abutting portion abutting on the support member, and the abutting portion is spaced apart from the first protruding portion in a direction from the first shielding wall towards any of the LED chips along the axial direction of the tube.

In a preferred embodiment of the invention, the cap includes a third shielding wall overlapping with the third end portion and the fourth end portion on the peripheral direction. A thickness of the third semi-cylinder portion and a thickness of the fourth semi-cylinder portion are both greater than any of the first semi-cylinder portion and the second semi-cylinder portion, and the third shielding wall overlaps with any of the third semi-cylinder portion and the fourth semi-cylinder portion in a diameter direction of the tube.

In a preferred embodiment of the invention, a thickness of the third semi-cylinder portion and a thickness of the fourth semi-cylinder portion are both greater than any of the to first semi-cylinder portion and the second semi-cylinder portion, and the fourth semi-cylinder portion has a notch formed thereon and the support member is embedded in the notch.

In a preferred embodiment of the invention, the LED lamp further includes a circuit part accommodated in the cap. The circuit part includes a diode bridge having two input terminals and two output terminals and a resistor electrically disposed between the input terminals, and the LED chips are electrically disposed between the output terminals.

In a preferred embodiment of the invention, the circuit part includes an AC/DC converter for converting an input commercial AC voltage into a DC voltage.

A third embodiment of the invention provides a method for manufacturing an LED lamp, which includes the following steps: disposing a plurality of LED chips on a heat dissipation component; accommodating the heat dissipation component and the LED chips in a tube; and adhering the heat dissipation component and the tube via an adhesive agent. In the adhesion step, an opening of a nozzle moves between the heat dissipation component and the tube along an axial direction of the tube, and meanwhile the adhesive agent is discharged from the opening.

Other features and advantages of the invention can be described in further detail below with reference to the accompanying drawings.

DETAILED DESCRIPTION OF THE INVENTION

Preferred embodiments of the present invention are described in detail below with reference to the accompanying drawings.

<First Embodiment>

A first embodiment of the invention is described with reference to FIGS. 1-20.

Figure 1:
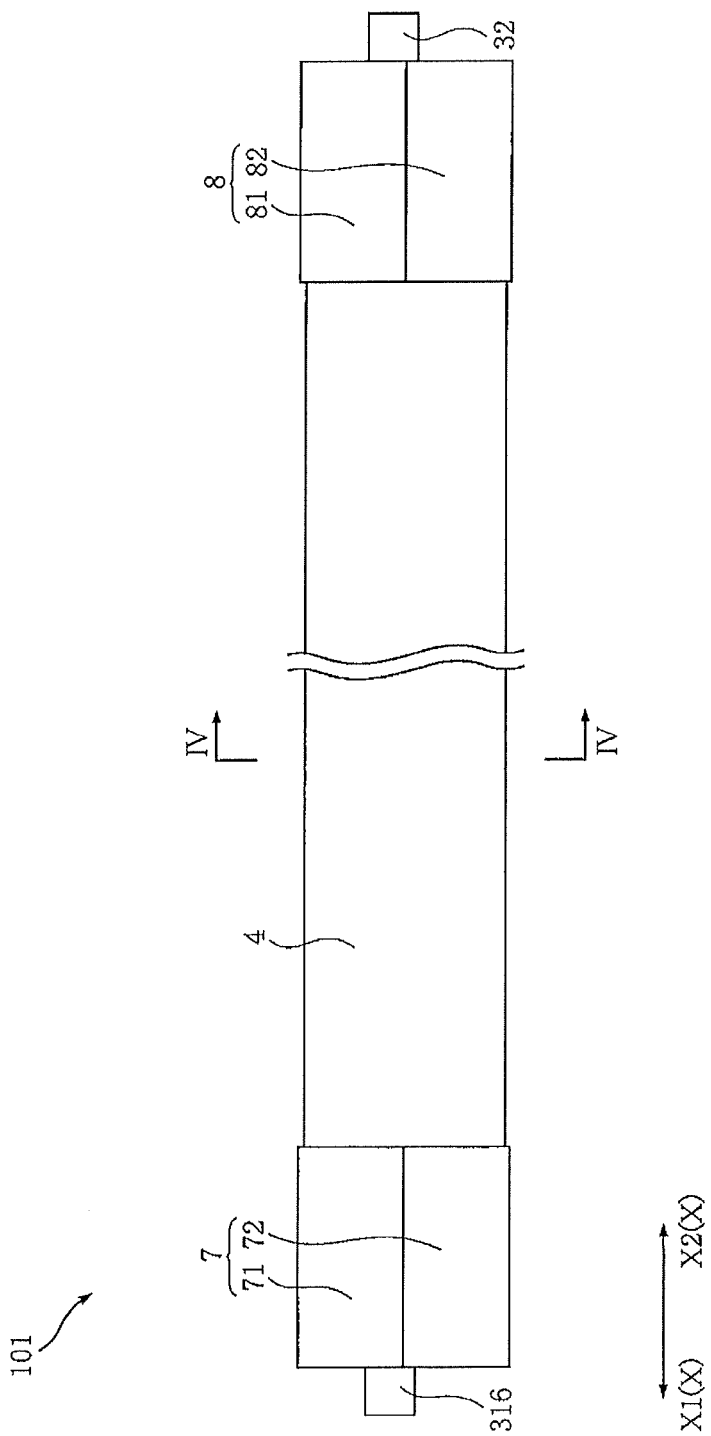
FIG. 1 is a front view of an LED lamp according to a first embodiment of the invention.
Figure 2:
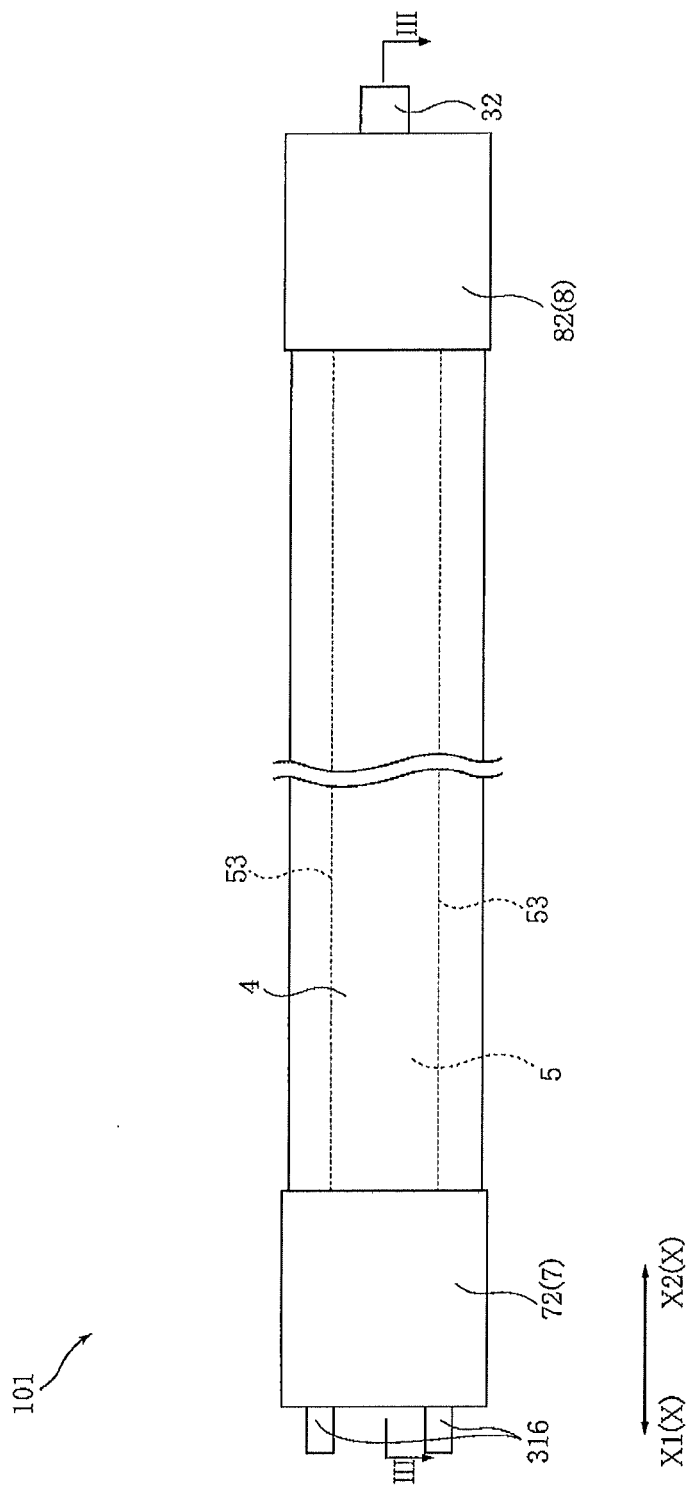
FIG. 2 is a bottom view of the LED lamp according to the first embodiment of the invention.
Figure 3:
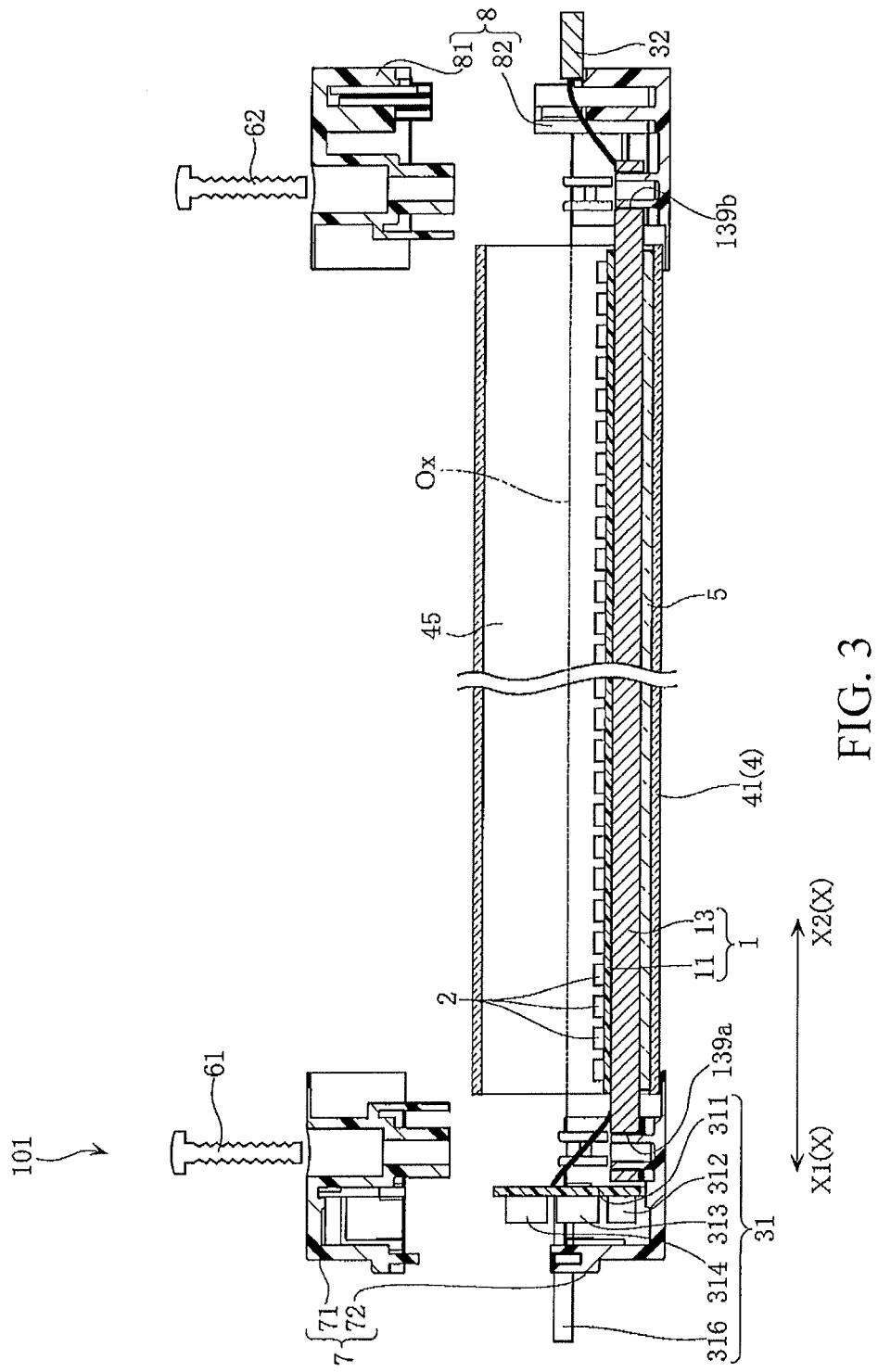
FIG. 3 is a cross-sectional exploded view along Line III-III in FIG. 2.
Figure 4:
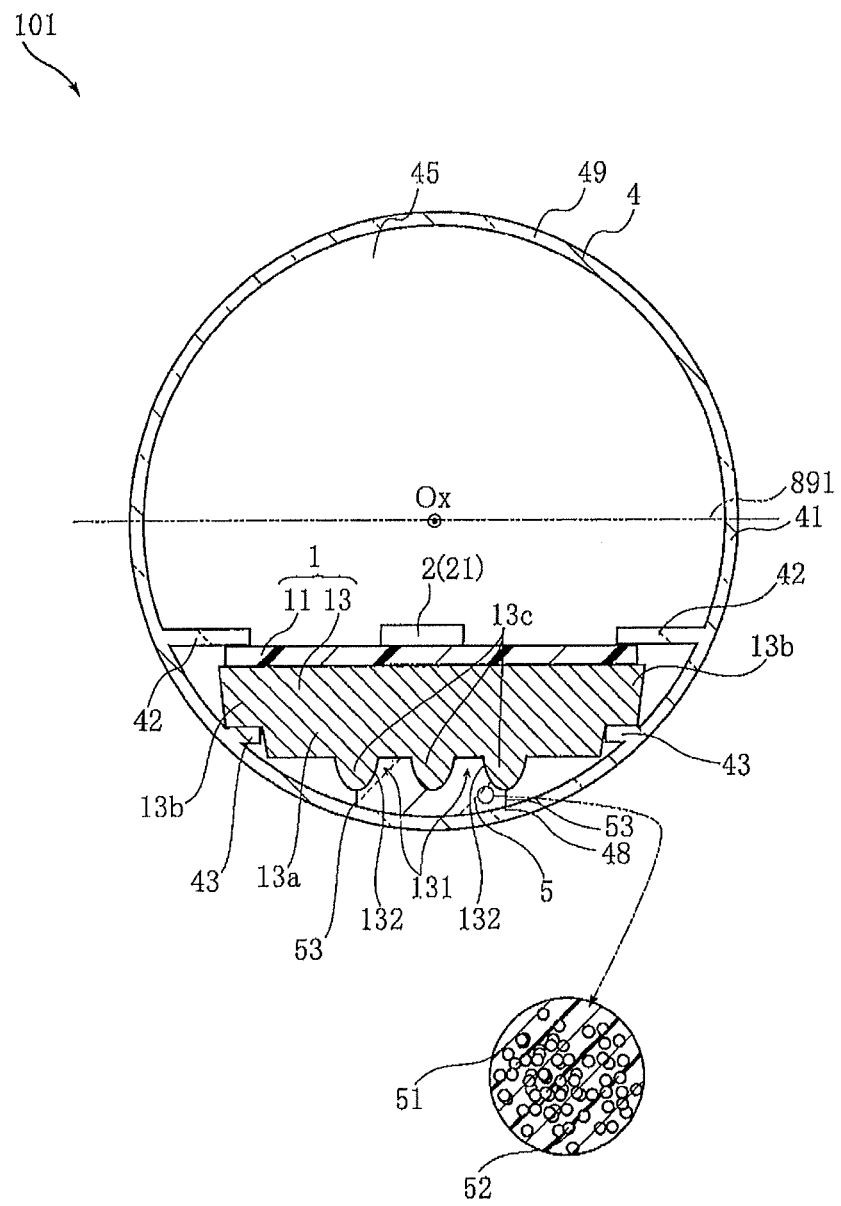
FIG. 4 is a cross-sectional view along Line IV-IV in FIG. 1.

FIG. 1 is a front view of an LED lamp in this embodiment. FIG. 2 is a bottom view of the LED lamp in this embodiment. FIG. 3 is a cross-sectional exploded view along Line III-III in FIG. 2. FIG. 4 is a cross-sectional view along Line IV-IV in FIG. 1.

The LED lamp 101 shown in the figures includes a support member 1, LED modules 2, a circuit part 31, a ground terminal 32, a tube 4, an adhesive layer 5 and caps 7, 8. The LED lamp 101 is used to replace a straight-tube type fluorescent lamp.

Figure 18:
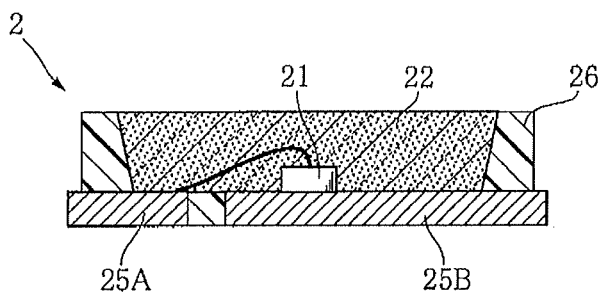
FIG. 18 is a cross-sectional view of main parts that form an LED module.

FIG. 18 is a cross-sectional view of main parts that form the LED module 2.

The LED module 2 in FIG. 3 and FIG. 4 is specified in FIG. 18, which includes an LED chip 21, sealing resin 22, wires 25A, 25B and a reflector 26. The LED module 2 is about 4.0 mm wide, 2.0 mm long and 0.6 mm thick. The LED module 2 is miniature and is rather thin.

The wires 25A, 25B are respectively plate-shaped members made of, for example, Cu—Ni alloy. The wires 25A, 25B respectively serve as mounting terminals for performing surface mounting on the LED module 2. The reflector 26 includes, for example, white resin.

The LED chip 21 is an optical source of the LED module 2, and emits, for example, visible light. The LED chip 21 is loaded, for example, through silver paste, on the wire 25B. The LED chip 21 is electrically connected to the wire 25B. The LED chip 21 is electrically connected to the wire 25A via a lead. The current flows in the LED chip 21, so that the LED chip 21 emits light, and the LED chip 21 (the LED module 2) generates heat.

The sealing resin 22 is used to protect the LED chip 21. The sealing resin 22 includes, for example, epoxy resin which is transparent for the light emitted from the LED chip 21. Alternatively, the sealing resin 22 includes, for example, transparent resin, which includes a fluorescent material capable of emitting light of different wavelengths when excited by the light emitted from the LED chip 21. The blue light from the LED chip 21 is mixed with the yellow light from the fluorescent material in the sealing resin 22, and the LED module 2 emits white light.

The support member 1 shown in FIG. 3 and FIG. 4 supports the LED modules 2. The support member 1 includes a substrate 11, a wiring pattern (not shown in the drawings), and a heat dissipation component 13. The substrate 11 includes, for example, glass epoxy resin. The substrate 11 is rectangular and extends along a plane covering a direction X (an extending direction of an axis Ox of the tube 4). On the substrate 11, the LED modules 2 are disposed along the direction X. The wiring pattern is formed on the substrate 11, and includes a conductive material. The wiring pattern provides power for each LED module 2.

The heat dissipation component 13 is used for effectively dissipating the heat generated by each LED module 2 out of the LED lamp 101. The heat dissipation component 13 extends along the direction X. The substrate 11 is joined on the heat dissipation component 13. The heat dissipation component 13 supports the substrate 11 and the LED modules 2. The heat dissipation component 13 includes a material having a relatively high thermal conductivity. The thermal conductivity of the material that forms the heat dissipation component 13 is greater than that of the material for forming the substrate 11. The heat dissipation component 13 includes, for example, Al.

Referring to FIG. 4, the heat dissipation component 13 includes a base portion 13a and convex portions 13b, 13c. The base portion 13a is in a shape extending along the direction X. Each convex portion 13b protrudes from the base portion 13a along the substrate 11. Each convex portion 13b extends along the direction X. The base portion 13a and the convex portion 13b support the substrate 11. Each convex portion 13c protrudes from the base portion 11a in a manner of being spaced apart from the LED module 2. Each convex portion 13c extends along the direction X. A plurality of first grooves 131 (two are provided in this embodiment) are formed on the heat dissipation component 13. Each groove 131 is located between two adjacent convex portions 13c. Each groove 131 extends along the direction X. In this embodiment, each groove 131 is formed by crossing from one end to the other end of the heat dissipation component 13 in the direction X. Each groove 131 is defined by a groove surface 132. Referring to FIG. 3, through holes 139a, 139b are formed on the heat dissipation component 13. The through hole 139a is located on one end of the heat dissipation component 13 in the direction X, and the through hole 139b is located on the other end of the heat dissipation component 13 in the direction X.

Figure 17:
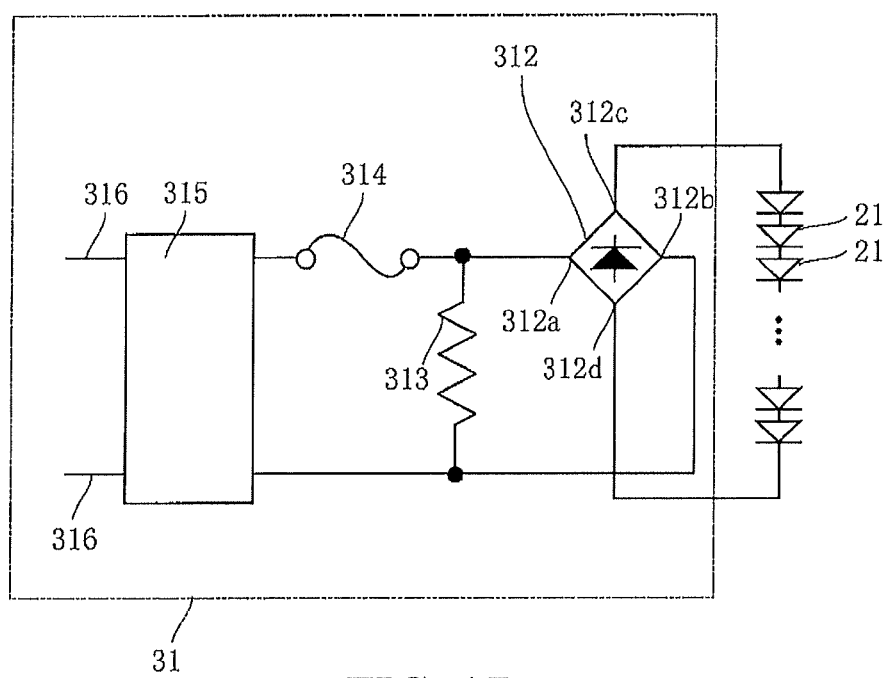
FIG. 17 is a circuit diagram of an LED lamp.

FIG. 17 is a circuit diagram of the LED lamp 101.

The circuit part 31 shown in FIG. 3 and FIG. 17 includes a substrate 311, a diode bridge 312, a resistor 313, a fuse 314, an AC/DC converter 315 (not shown except in FIG. 17) and two terminals 316. The substrate 311 includes, for example, glass epoxy resin. Each terminal 316 provides power for the LED chip 21 from the outside of the LED lamp 101. Each terminal 316 is inserted into any of two insertion slots formed for disposing the socket of the LED lamp 101.

The diode bridge 312 includes two input terminals 312a, 312b and two output terminals 312c, 312d. The LED chips 21 are electrically inserted between the output terminals 312c and 312d. The diode bridge 312 outputs an absolute value of a voltage of the input terminal 312a relative to the input terminal 312b as a voltage of the output terminal 312c relative to the output terminal 312d. Therefore, when the LED lamp 101 is used, the diode bridge 312 generally enables the current to flow towards an anode side of the LED chip 21. Therefore, it is not necessary to consider which terminal 316 is to be inserted into which the insertion slots of the socket. The resistor 313 is electrically inserted between the input terminals 312a, 312b. The resistor 313 is mounted on the socket when a circuit (not shown in the drawings) is used for detecting the LED lamp 101.

The fuse 314 is connected to the terminal 316 and the output terminal 312a, and is electrically disposed between the terminal 316 and the output terminal 312a. The circuit part 31 does not need to have the fuse 314. The AC/DC converter 315 is disposed between the terminals 316 and the input terminals 312a, 312b. The AC/DC converter 315 converts an AC current provided through the terminals 316 into a DC constant current. Further, the circuit part 31 can do not include the AC/DC converter 315.

As shown in FIGS. 1-3, the ground terminal 32 is electrically connected to the heat dissipation component 13. When the LED lamp 101 is used, the ground terminal 32 is grounded. Therefore, when the heat dissipation component 13 includes a conductive material, and the LED lamp 101 with the current flowing in the LED chip 21 is used, even if a user's hand touches the heat dissipation component 13, no electric shock will be caused.

The tube 4 is used for protecting the support member 1 and the LED modules 2. The tube 4 accommodates the support member 1 and the LED modules 2. The tube 4 extends in the direction X. The tube 4 includes, for example, resin such as polycarbonate. The tube 4 is formed by extrusion. The tube 4 may also include glass. The linear expansion coefficient of the material that forms the tube 4 is generally greater than that of the material for forming the heat dissipation component 13. In this embodiment, the size of the tube 4 in the direction X is smaller than that of the support member 1 in the direction X. The tube 4 is opened towards a direction X1 in the direction X, and opened in a direction X2 (reverse to the direction X1) in the direction X. The support member 1 protrudes from the opening of the tube 4 in the direction X1 towards the direction X1. Similarly, the support member 1 protrudes from the opening of the tube 4 in the direction X2 towards the direction X2. The tube 4A has a light passing space 45 formed thereon and allowing the light emitted from the LED chip 21 to pass through. In this embodiment, the light passing space 45 is a space at one side of the axis Ox opposite to the support member 1 in the inner space of the tube 4.

Referring to FIG. 4, in this embodiment, the LED modules 2 (including the LED chips 21), the heat dissipation component 13, and the adhesive layer 5 are together accommodated in any of two spaces divided by a virtual plane 891 of the axis Ox of the tube 4 in a space surrounded and defined by the tube 4 (a space having a circular cross-section in this embodiment). In FIG. 4, a portion of the tube 4 facing one of the spaces (a lower portion in FIG. 4) is set as a portion 48, and a portion of the tube 4 facing the other one of the spaces (an upper portion in FIG. 4) is set as a portion 49.

Referring to FIG. 4, the tube 4 includes an outer-cylinder portion 41 and a plurality of protruding plates 42, 43. The outer-cylinder portion 41 is cylindrical, and has a circular cross-section in a plane perpendicular to the direction X. The protruding plates 42, 43 extend from the outer-cylinder portion 41 in the direction along the width of the substrate 11. The protruding plates 42, 43 are in a shape extending along the direction X. Each protruding plate 42 abuts on an upper side of the substrate 11 in FIG. 4. Each protruding plate 43 abuts on the convex portion 13b in the heat dissipation component 13. The protruding plates 42, 43 prevent the support member 1 from becoming offset in the tube 4.

Referring to FIG. 4, the heat dissipation component 13 of the support member 1 is adhered to the tube 4 via the adhesive layer 5. The adhesive layer 5 is disposed between the heat dissipation component 13 and the tube 4. The adhesive layer 5 is directly connected to the heat dissipation component 13 and the tube 4. In this embodiment, the adhesive layer 5 is formed on each groove 131. The adhesive layer 5 is in a shape extending along the direction X. The adhesive layer 5 is connected to the groove surface 132 by crossing from one end to the other end of the groove surface 132 in the direction X. Similarly, the adhesive layer 5 is connected to the tube 4 by crossing from one end to the other end of the tube 4 in the direction X. Referring to FIG. 2 and FIG. 4, the adhesive layer 5 has end edges 53 respectively extending along the direction X.

Referring to FIG. 4, the adhesive layer 5 includes a resin portion 51 and a filler 52. The resin portion 51 includes, for example, silicone resin or epoxy resin. The filler 52 is dispersed in the resin portion 51. The filler 52 includes a material having a thermal conductivity greater than that of the material for forming the resin portion 51. Such material includes, for example, titanium oxide. A rubber with a product number of KE3467 from Shin-Etsu Silicones may be used as the adhesive layer 5.

Referring to FIGS. 1-3, the cap 7 is located at one end of the tube 4 in the direction X1. The cap 7 blocks the opening of the tube 4 in the direction X1. The cap 7 is fixed on the support member 1. In another embodiment, a few gaps exist between the cap 7 and the tube 4. Therefore, the cap 7 partially contacts the tube 4, and is not fixed to it. The cap 7 includes, for example, resin, ceramics or metal. The cap 7 in this embodiment includes resin. The cap 7 accommodates the circuit part 31. The terminal 316 protrudes from the cap 7. In this embodiment, the cap 7 includes a first member 71 and a second member 72. The first member 71 and the second member 72 are respectively integrally formed. Alternatively, unlike this embodiment, the cap 7 can be entirely integrally formed.

Figure 5:
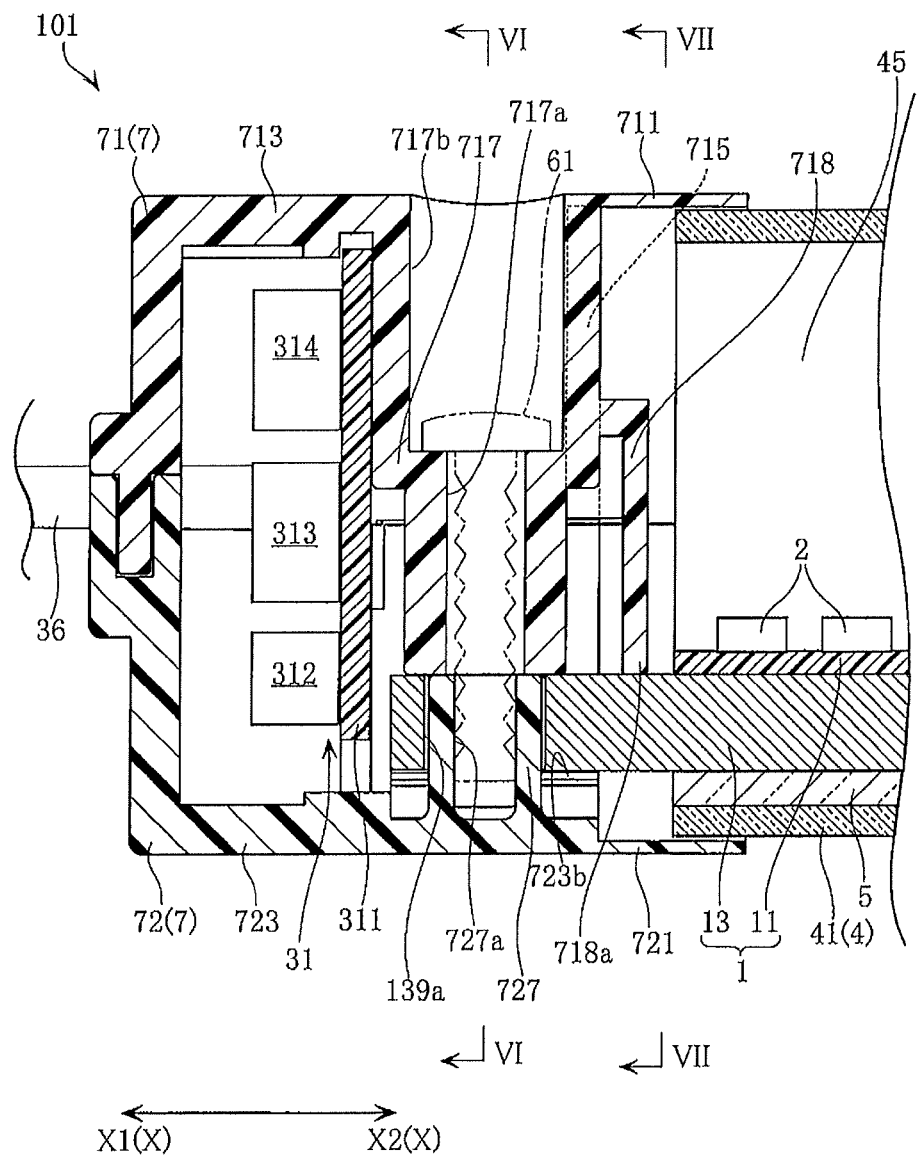
FIG. 5 is a partial enlarged view of FIG. 3.
Figure 6:
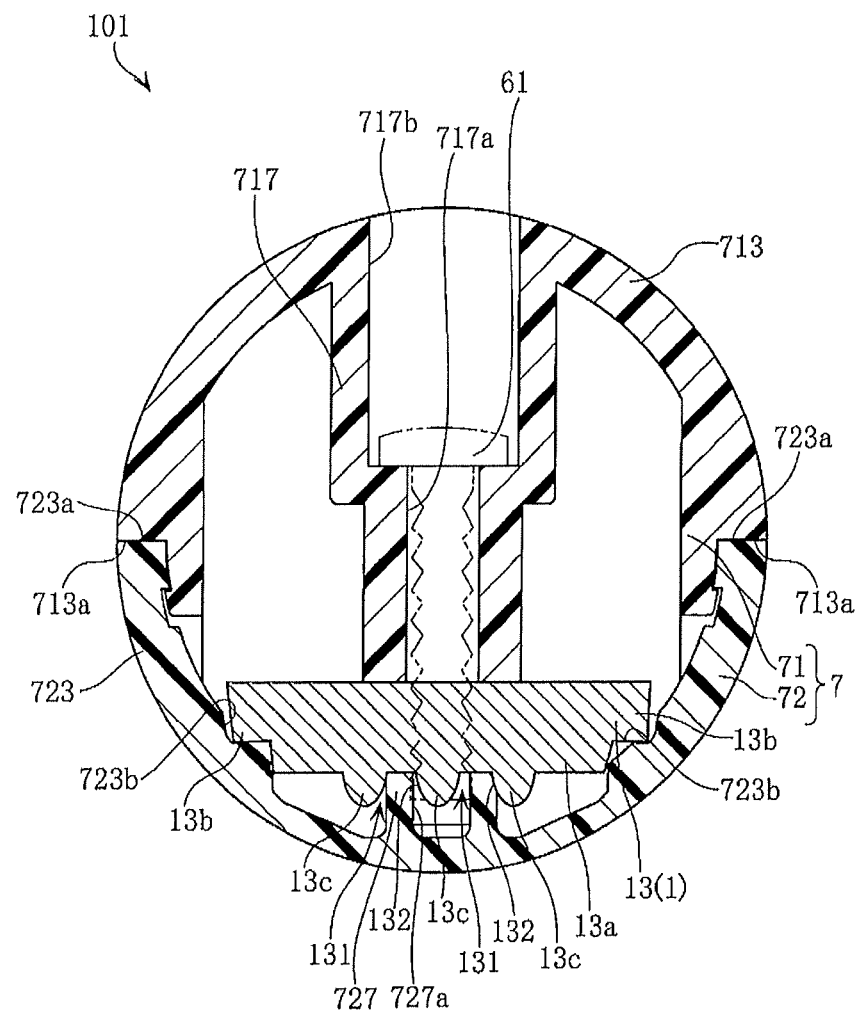
FIG. 6 is a cross-sectional view along Line VI-VI in FIG. 5.
Figure 7:
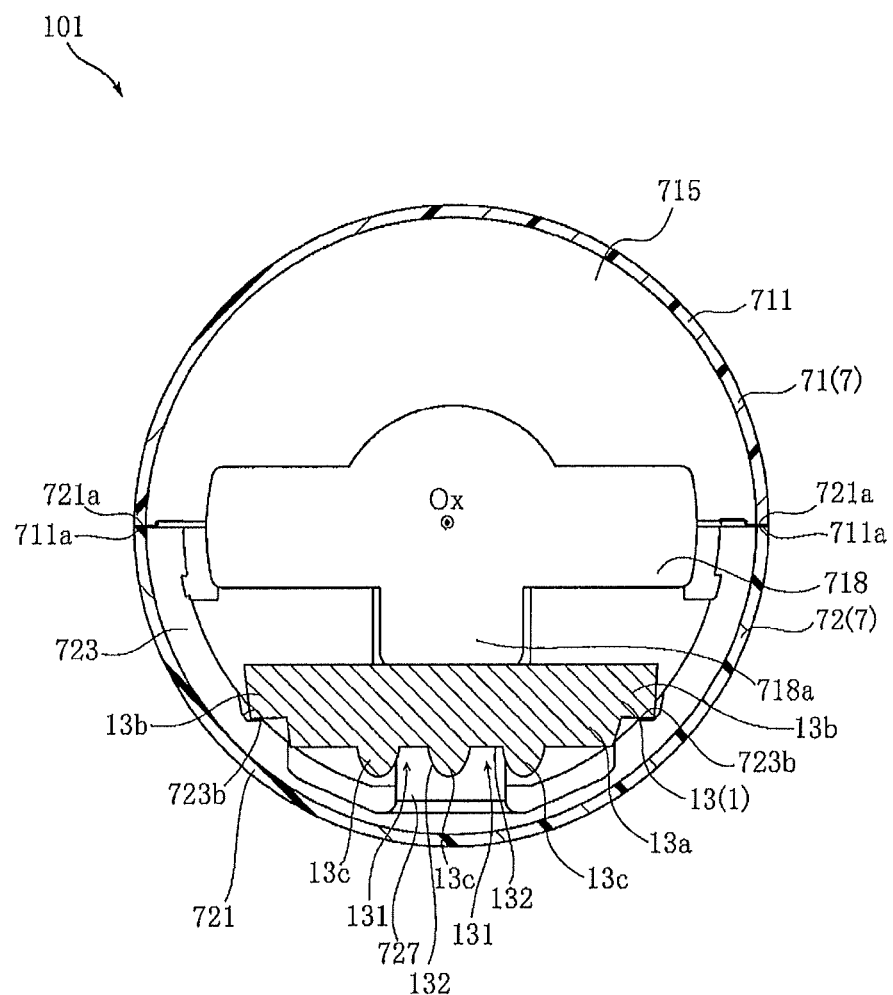
FIG. 7 is a cross-sectional view along Line VII-VII in FIG. 5.
Figure 8:
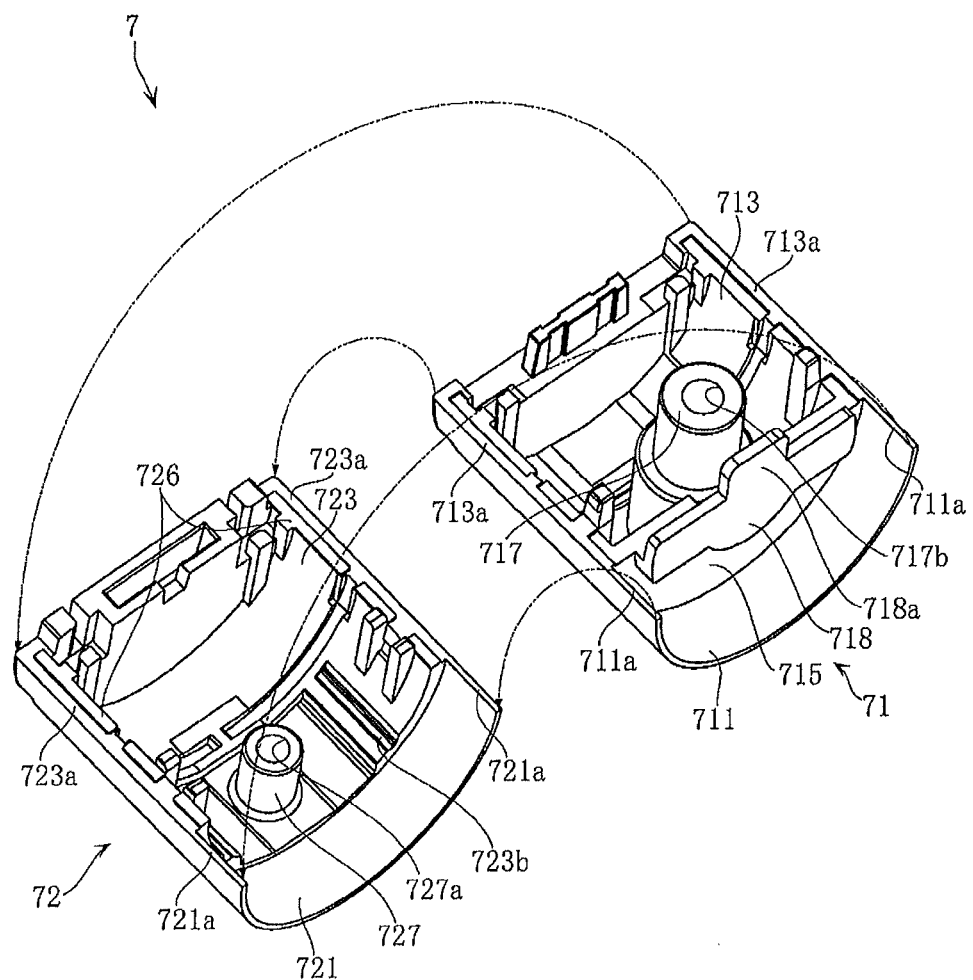
FIG. 8 is a three-dimensional exploded view of a cap on the left side of FIG. 3.
Figure 9:
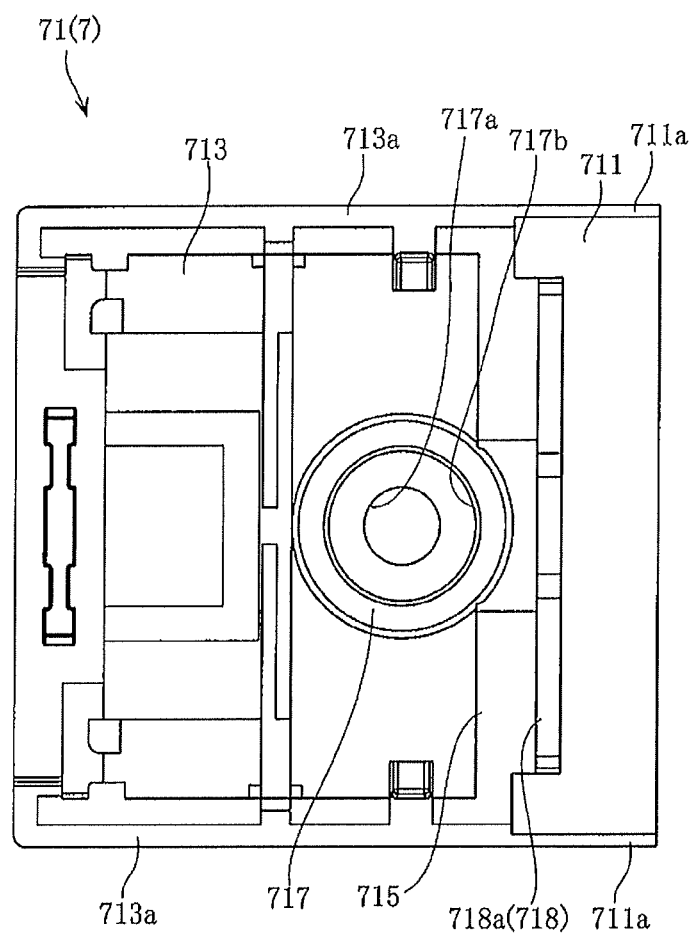
FIG. 9 is a top view of a first member of the cap in FIG. 8.
Figure 10:
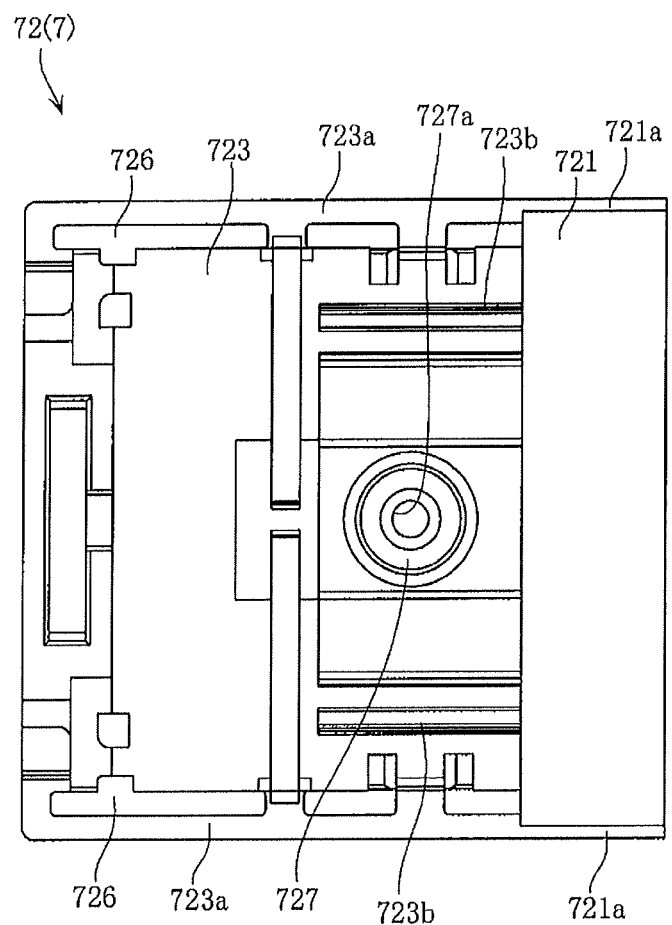
FIG. 10 is a top view of a second member of the cap in FIG. 8.

FIG. 5 is a partial enlarged view of FIG. 3. FIG. 6 is a cross-sectional view along Line VI-VI in FIG. 5. FIG. 7 is a cross-sectional view along Line VII-VII in FIG. 5. FIG. 8 is a three-dimensional exploded view of the cap 7 in the left side of FIG. 3. FIG. 9 is a top view of the first member 71 of the cap 7 in FIG. 8. FIG. 10 is a top view of the second member 72 of the cap 7 in FIG. 8.

Referring to FIGS. 5-9, the first member 71 includes a semi-cylinder portion 711 (the first semi-cylinder portion), a semi-cylinder portion 713 (the third semi-cylinder portion), a shielding wall 715 (the first shielding wall), a protruding portion 717 (the first protruding portion) and a support wall 718.

The cross-section of the semi-cylinder portion 711 is in a recessed shape opened in a direction. In this embodiment, the semi-cylinder portion 711 is semi-cylindrical. The semi-cylinder portion 711 includes end portions 711a. E ach end portion 711a serves as the first end portion, and is located at one end on the peripheral direction of the tube 4 (in a rotation direction about the axis Ox) in the semi-cylinder portion 711. The end portions 711a face the same direction (a downward direction in FIG. 7). The semi-cylinder portion 713 is connected to the semi-cylinder portion 711. Referring to FIG. 5, the semi-cylinder portion 713 is located in the direction X1 relative to the semi-cylinder portion 711 in the direction X. The cross-section of the semi-cylinder portion 713 is in a recessed shape opened in a direction. In this embodiment, the semi-cylinder portion 713 is semi-cylindrical. A thickness of the semi-cylinder portion 713 (the size thereof in the diameter direction of the tube 4) is greater than that of the semi-cylinder portion 711 (the size thereof in the diameter direction of the tube 4). The semi-cylinder portion 713 includes end portions 713a. Each end portion 713a serves as the third end portion, and is located at one end on the peripheral direction of the tube 4. The end portions 713a face the same direction (a downward direction in FIG. 6).

The shielding wall 715 shown in FIGS. 7-9 stands upright from the semi-cylinder portion 711 towards the axis Ox when observed from the direction X. The shielding wall 715 faces the light passing space 45. Referring to FIG. 5, the shielding wall 715 overlaps with the support member 1 in the direction X. The shielding wall 715 expands along a plane perpendicular to the axis Ox. Referring to FIG. 8, in this embodiment, the shielding wall 715 covers the entire peripheral direction of the tube 4 on an inner surface of the semi-cylinder portion 711 and is connected to the semi-cylinder portion 711.

Referring to FIG. 5, the protruding portion 717 is connected to the semi-cylinder portion 713. The protruding portion 717 protrudes from the semi-cylinder portion 713 towards the support member 1. The protruding portion 717 is directly connected to the support member 1.

Referring to FIG. 5, a hole 717a and a hole 717b are formed on the first member 71 of the cap 7. The hole 717a is formed on the protruding portion 717 as a first hole. The hole 717a is opened towards the through hole 139a of the heat dissipation component 13. The hole 717b is formed on the protruding portion 717 and the semi-cylinder portion 713. The hole 717b is in communication with the hole 717a, and is opened towards an opposite side of the side where the support member 1 is disposed.

Referring to FIG. 5, the support wall 718 is connected to the shielding wall 715. The support wall 718 includes an abutting portion 718a abutting on the support member 1 (the heat dissipation component 13 in this embodiment). The abutting portion 718a is spaced apart from the protruding portion 717 in a direction from the shielding wall 715 towards any of the LED chips 21 along the direction X. That is to say, referring to FIG. 5, the abutting portion 718a is located in the direction X2 relative to the protruding portion 717.

Referring to FIGS. 5-8 and FIG. 10, the second member 72 includes a semi-cylinder portion 721 (the second semi-cylinder portion), a semi-cylinder portion 723 (the fourth semi-cylinder portion), a shielding wall 726 (the third shielding wall) and a protruding portion 727 (the second protruding portion).

The cross-section of the semi-cylinder portion 721 is in a recessed shape opened in a direction. In this embodiment, the semi-cylinder portion 721 is semi-cylindrical. The semi-cylinder portion 721 includes end portions 721a. Each end portion 721a serves as the second end portion, and is located at one end on the peripheral direction of the tube 4 in the semi-cylinder portion 721. The end portions 721a face the same direction (an upward direction in FIG. 7). The end portions 721a and the end portions 711a face each other. The semi-cylinder portion 711 and the semi-cylinder portion 721 together surround the tube 4. The semi-cylinder portion 723 is connected to the semi-cylinder portion 721. Referring to FIG. 5, the semi-cylinder portion 723 is located in the direction X1 relative to the semi-cylinder portion 721 in the direction X. The cross-section of the semi-cylinder portion 723 is in a recessed shape opened in a direction. In this embodiment, the semi-cylinder portion 723 is semi-cylindrical. A thickness of the semi-cylinder portion 723 (the size thereof in the diameter direction of the tube 4) is greater than that of the semi-cylinder portion 721 (the size thereof in the diameter direction of the tube 4). The semi-cylinder portion 723 abuts on the support member 1 (the heat dissipation component 13 in this embodiment). The semi-cylinder portion 723 includes end portions 723a. Each end portion 723a is located at one end on the peripheral direction of the tube 4. The end portions 723a face the same direction (an upward direction in FIG. 6). The end portions 723a and the end portions 713a face each other. The semi-cylinder portion 713 and the semi-cylinder portion 723 surround the circuit part 31. The semi-cylinder portion 723 has a notch 723b formed thereon. The support member 1 (the heat dissipation component 13 in this embodiment) is embedded in the notch 723b. Thereby, the support member 1 is prevented from being offset in a transverse direction in FIG. 6 and FIG. 7.

As shown in FIG. 8, the shielding wall 726 is connected to the semi-cylinder portion 723. The shielding wall 726 overlaps with the end portions 713a and the end portions 723a on the peripheral direction of the tube 4. Alternatively, unlike this embodiment, the shielding wall 726 is not connected to the semi-cylinder portion 723, but connected to the semi-cylinder portion 713.

Referring to FIG. 5, the protruding portion 727 is connected to the semi-cylinder portion 723. The protruding portion 727 protrudes from the semi-cylinder portion 723 towards the support member 1. In this embodiment, the protruding portion 727 is embedded in the through hole 139a of the heat dissipation component 13.

Referring to FIG. 5, a hole 727a is formed on the second member 72 of the cap 7. The hole 727a serves as a second hole, and is formed on the protruding portion 727. The hole 727a is opened towards the hole 717a of the protruding portion 717. The hole 727a is in communication with the hole 717a of the protruding portion 717.

Referring to FIG. 5, screws 61 are inserted in the holes 717a, 727a. Therefore, the first member 71 is fixed relative to the second member 72. In view of the above, the support member 1 (the heat dissipation component 13) abuts on the protruding portion 717 of the first member 71. A force is applied from the protruding portion 717 to the support member 1 towards the second member 72. In this case, the support member 1 (the heat dissipation component 13) abuts on the semi-cylinder portion 723 of the second member. A force is applied from the semi-cylinder portion 723 to the support member 1 towards the first is member 71. Thereby, the force from the protruding portion 717 towards the second member 72 is applied on the support member 1, and the force from the semi-cylinder portion 723 towards the first member 71 is applied on the support member 1, which means that the support member 1 is clamped by the protruding portion 717 and the semi-cylinder portion 723.

Referring to FIGS. 1-3, the cap 8 is located at one end of the tube 4 in the direction X2. The cap 8 has a constitution almost the same as the cap 7. The cap 8 blocks the opening of the tube 4 in the direction X2. The cap 8 is fixed on the support member 1. A few gaps exist between the cap 8 and the tube 4. Therefore, the cap 8 partially contacts the tube 4, and is not fixed to it. The cap 8 is composed of, for example, resin, ceramics or metal. The cap 8 in this embodiment is composed of resin. The ground terminal 32 protrudes from the cap 8. In this embodiment, the cap 8 includes a first member 81 and a second member 82. The first member 81 and the second member 82 are each integrally formed. Alternatively, unlike this embodiment, the cap 8 is entirely integrally formed.

Figure 11:
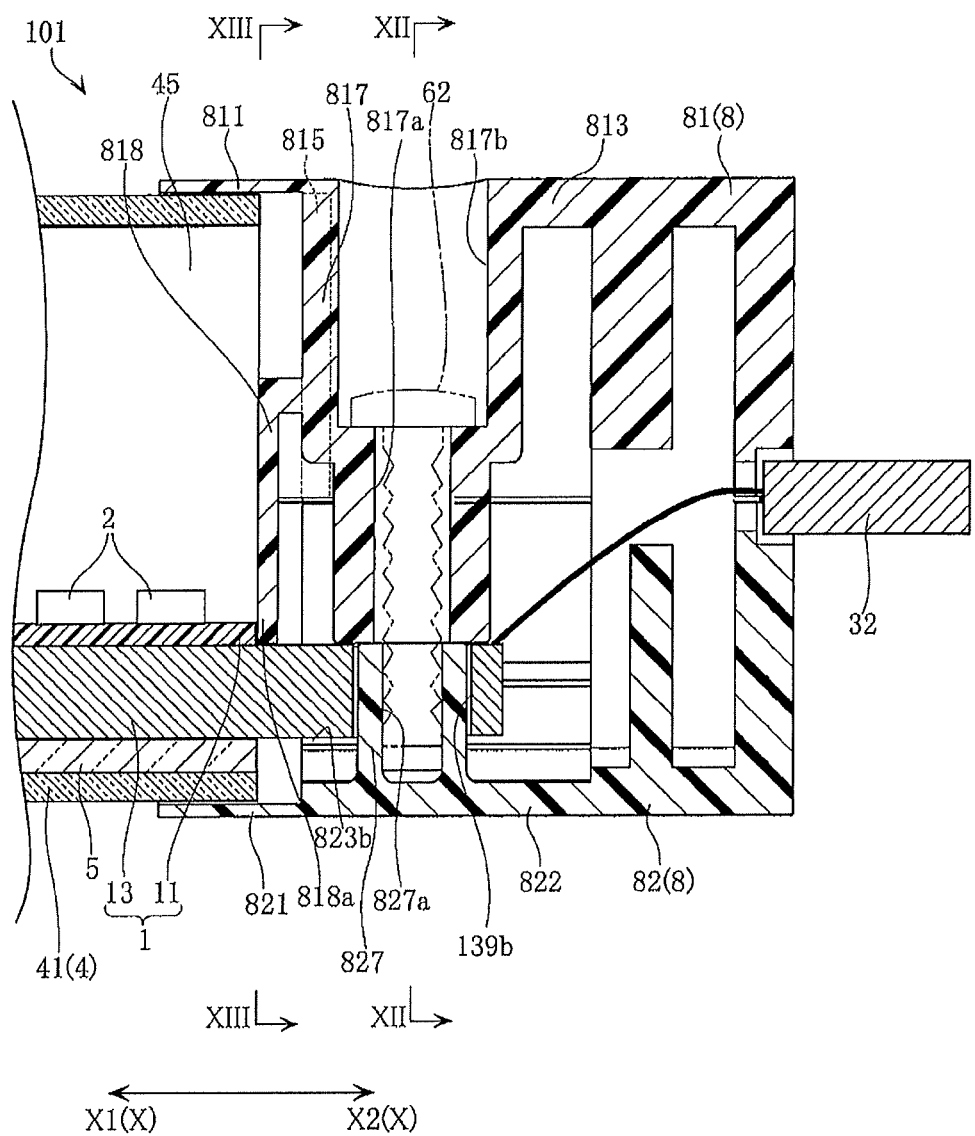
FIG. 11 is a partial enlarged view of FIG. 3.
Figure 12:
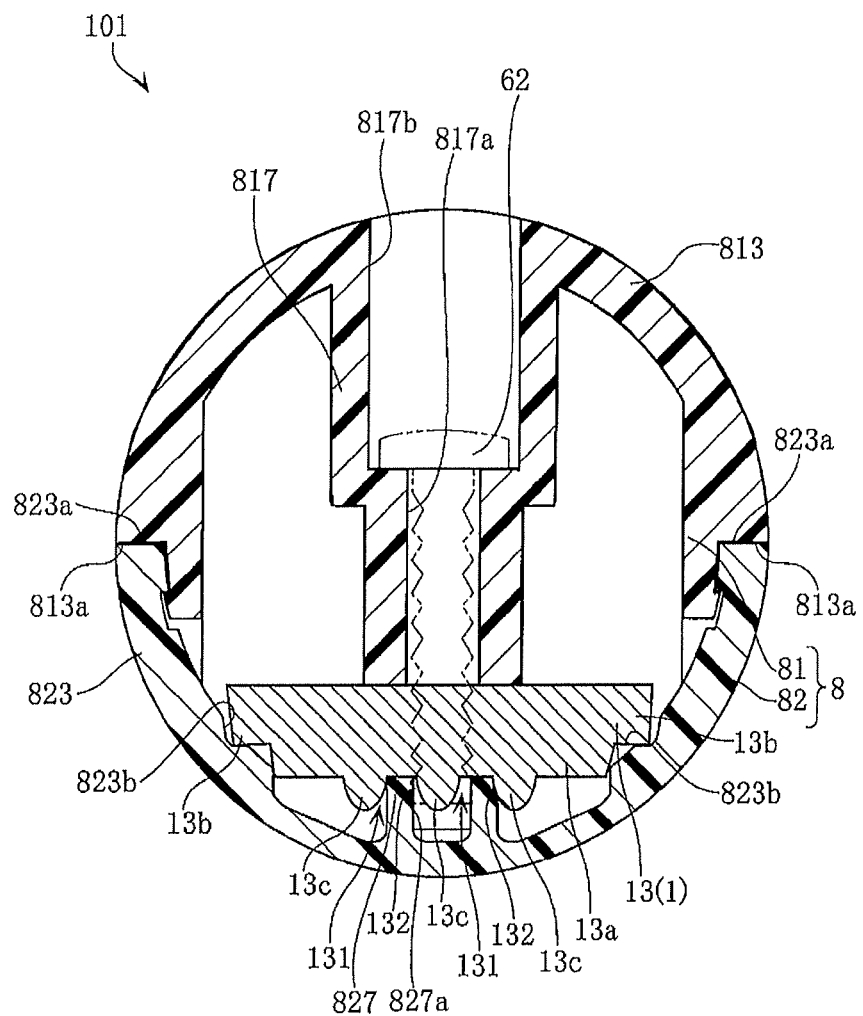
FIG. 12 is a cross-sectional view along Line XII-XII in FIG. 11.
Figure 13:
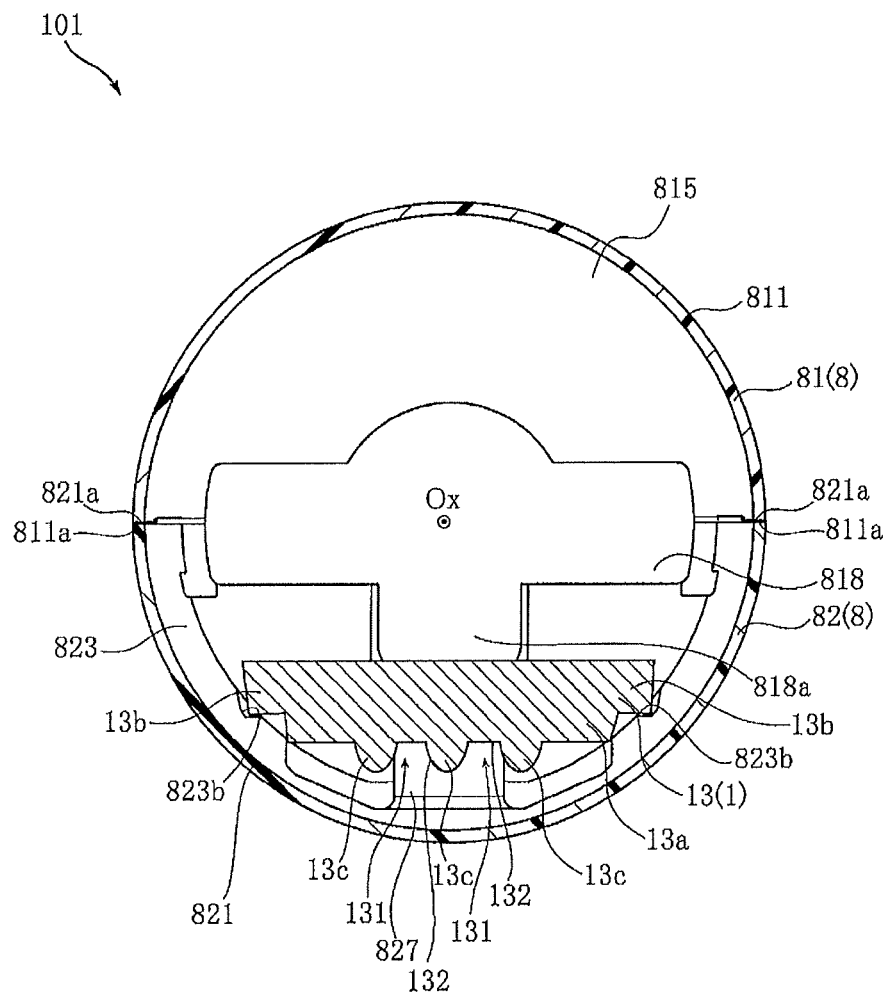
FIG. 13 is a cross-sectional view along Line XIII-XIII in FIG. 11.
Figure 14:
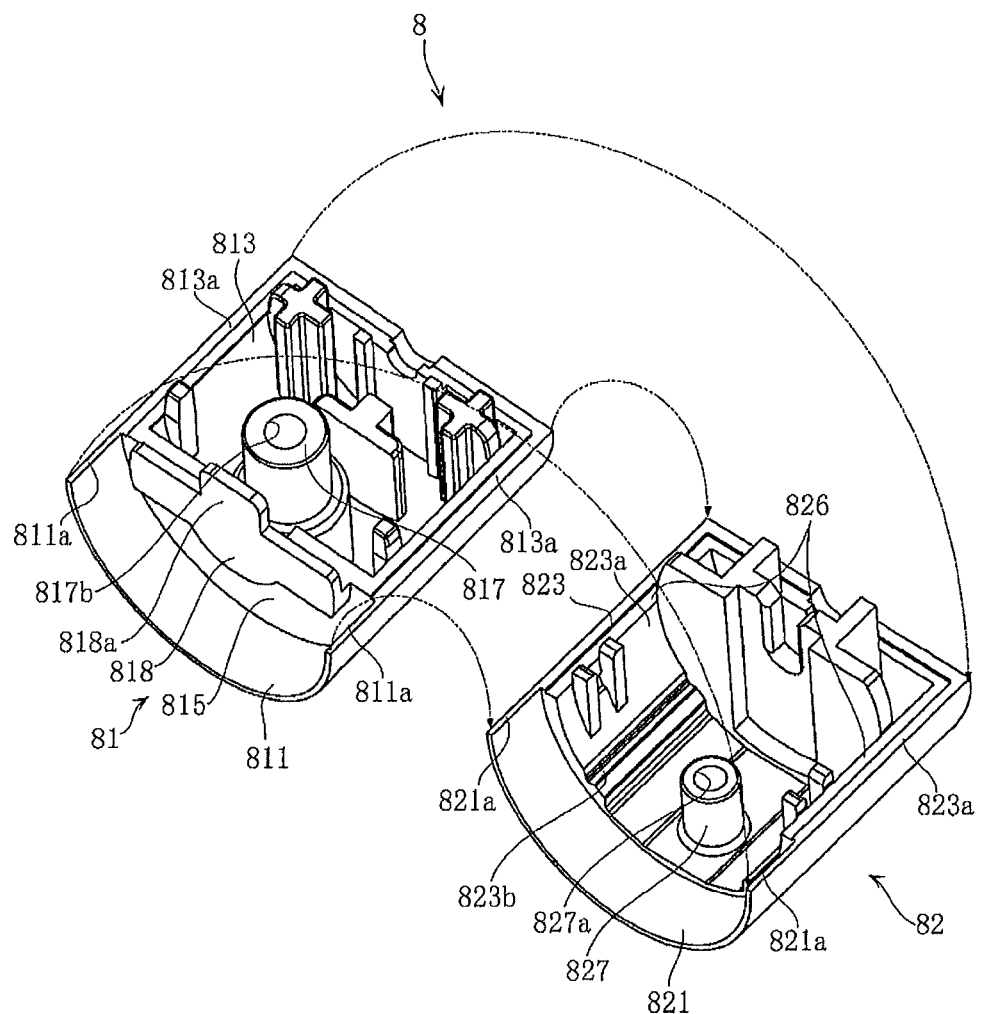
FIG. 14 is a three-dimensional exploded view of a cap on the right side of FIG. 3.
Figure 15:
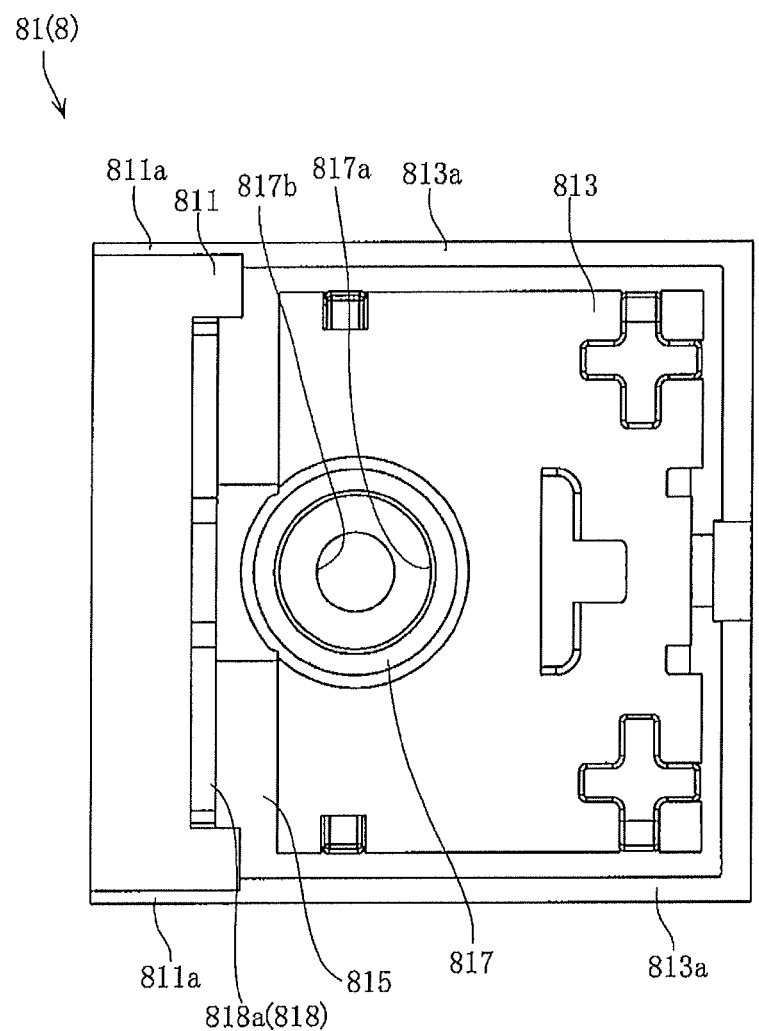
FIG. 15 is a top view of a first member of the cap in FIG. 14.
Figure 16:
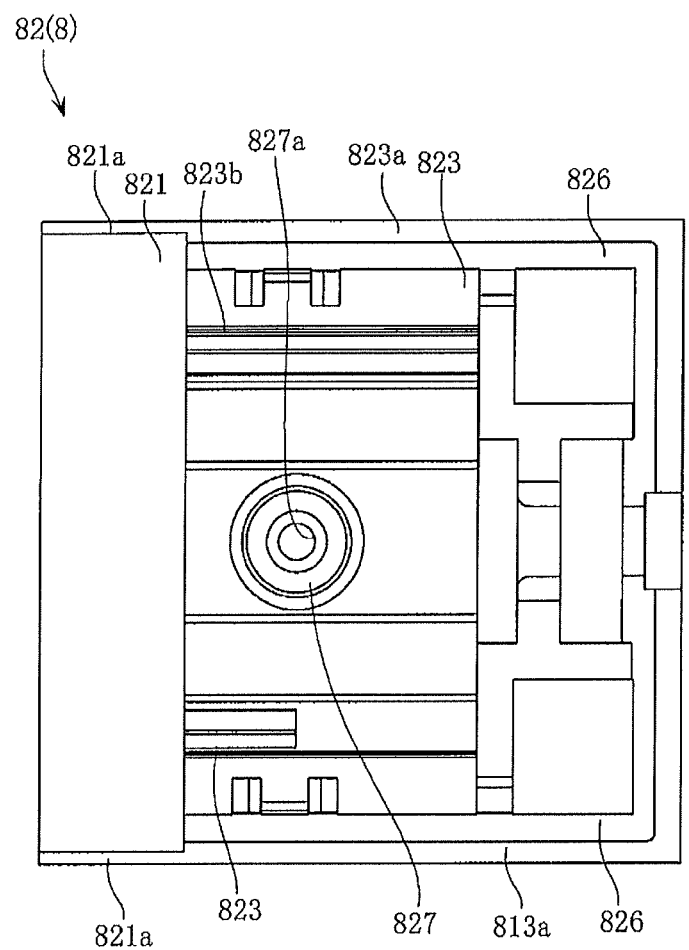
FIG. 16 is a top view of a second member of the cap in FIG. 14.

FIG. 11 is a partial enlarged view of FIG. 3. FIG. 12 is a cross-sectional view along Line XII-XII in FIG. 11. FIG. 13 is a cross-sectional view along Line XIII-XIII in FIG. 11. FIG. 14 is a three-dimensional exploded view of the cap 8 in the right side of FIG. 3. FIG. 15 is a top view of the first member 81 of the cap 8 in FIG. 14. FIG. 16 is a top view of the second member 82 of the cap 8 in FIG. 14.

Referring to FIGS. 11-15, the first member 81 includes a semi-cylinder portion 811 (the first semi-cylinder portion), a semi-cylinder portion 813 (the third semi-cylinder portion), a shielding wall 815 (the first shielding wall), a protruding portion 817 (the first protruding portion) and a support wall 818.

The cross-section of the semi-cylinder portion 811 is in a recessed shape opened in a direction. In this embodiment, the semi-cylinder portion 811 is semi-cylindrical. The semi-cylinder portion 811 includes end portions 811a. Each end portion 811a serves as the first end portion, and is located at one end on the peripheral direction of the tube 4 in the semi-cylinder portion 811. The end portions 811a face the same direction (a downward direction in FIG. 13). The semi-cylinder portion 813 is connected to the semi-cylinder portion 811. Referring to FIG. 11, the semi-cylinder portion 813 is located in the direction X2 relative to the semi-cylinder portion 811 in the direction X. The cross-section of the semi-cylinder portion 813 is in a recessed shape opened in a direction. In this embodiment, the semi-cylinder portion 813 is semi-cylindrical. A thickness of the semi-cylinder portion 813 (the size thereof in the diameter direction of the tube 4) is greater than that of the semi-cylinder portion 811 (the size thereof in the diameter direction of the tube 4). The semi-cylinder portion 813 includes end portions 813a. Each end portion 813a serves as the third end portion, and is located at one end on the peripheral direction of the tube 4. The end portions 813a face the same direction (a downward direction in FIG. 12).

The shielding wall 815 stands upright from the semi-cylinder portion 811 towards the axis Ox when observed from the direction X. The shielding wall 815 faces the light passing space 45. Referring to FIG. 11, the shielding wall 815 overlaps with the support member 1 in the direction X. The shielding wall 815 expands along a plane perpendicular to the axis Ox. Referring to FIG. 14, in this embodiment, the shielding wall 815 covers the entire peripheral direction of the tube 4 on an inner surface of the semi-cylinder portion 811 and is connected to the semi-cylinder portion 811.

Referring to FIG. 11, the protruding portion 817 is connected to the semi-cylinder portion 813. The protruding portion 817 protrudes from the semi-cylinder portion 813 towards the support member 1. The protruding portion 817 is directly connected to the support member 1.

Referring to FIG. 11, a hole 817a and a hole 817b are formed on the first member 81 of the cap 8. The hole 817a is formed on the protruding portion 817 as the first hole. The hole 817a is opened towards the through hole 139b of the heat dissipation component 13. The hole 817b is formed on the protruding portion 817 and the semi-cylinder portion 813. The hole 817b is in communication with the hole 817a, and is opened towards an opposite side of the side where the support member 1 is disposed.

Referring to FIG. 11, the support wall 818 is connected to the shielding wall 815. The support wall 818 includes an abutting portion 818a abutting on the support member 1 (the heat dissipation component 13 in this embodiment). The abutting portion 818a is spaced apart from the protruding portion 817 in a direction from the shielding wall 815 towards any of the LED chips 21 along the direction X. That is to say, referring to FIG. 11, the abutting portion 818a is located in the direction X1 relative to the protruding portion 817.

Referring to FIGS. 11-14 and FIG. 16, the second member 82 includes a semi-cylinder portion 821 (the second semi-cylinder portion), a semi-cylinder portion 824 (the fourth semi-cylinder portion), a shielding wall 826 (the third shielding wall) and a protruding portion 827 (the second protruding portion).

The cross-section of the semi-cylinder portion 821 is in a recessed shape opened in a direction. In this embodiment, the semi-cylinder portion 821 is semi-cylindrical. The semi-cylinder portion 821 includes end portions 821a. Each end portion 821a serves as the second end portion, and is located at one end on the peripheral direction of the tube 4 in the semi-cylinder portion 821. The end portions 821a face the same direction (an upward direction in FIG. 13). The end portions 821a and the end portions 811a face each other. The semi-cylinder portion 811 and the semi-cylinder portion 821 together surround the tube 4. The semi-cylinder portion 823 is connected to the semi-cylinder portion 821. Referring to FIG. 11, the semi-cylinder portion 823 is located in the direction X2 relative to the semi-cylinder portion 821 in the direction X. The cross-section of the semi-cylinder portion 823 is in a recessed shape opened in a direction. In this embodiment, the semi-cylinder portion 823 is semi-cylindrical. A thickness of the semi-cylinder portion 823 (the size thereof in the diameter direction of the tube 4) is greater than that of the semi-cylinder portion 821 (the size thereof in the diameter direction of the tube 4). The semi-cylinder portion 823 abuts on the support member 1 (the heat dissipation component 13 in this embodiment). The semi-cylinder portion 823 includes end portions 823a. Each end portion 823a is located at one end on the peripheral direction of the tube 4. The end portions 823a face the same direction (an upward direction in FIG. 12). The end portions 823a and the end portions 813a face each other. The semi-cylinder portion 823 has a notch 823b formed thereon. The support member 1 (the heat dissipation component 13 in this embodiment) is embedded in the notch 823b. Thereby, the support member 1 is prevented from being offset in a transverse direction in FIG. 12 and FIG. 13.

The shielding wall 826 is connected to the semi-cylinder portion 823. The shielding wall 826 overlaps with the end portions 813a and the end portions 823a on the peripheral direction of the tube 4. Alternatively, unlike this embodiment, the shielding wall 826 is not connected to the semi-cylinder portion 823, but connected to the semi-cylinder portion 813.

Referring to FIG. 11, the protruding portion 827 is connected to the semi-cylinder portion 823. The protruding portion 827 protrudes from the semi-cylinder portion 823 towards the support member 1. In this embodiment, the protruding portion 827 is embedded in the through hole 139b of the heat dissipation component 13.

Referring to FIG. 11, a hole 827a is formed on the second member 82 of the cap 8. The hole 827a serves as the second hole, and is formed on the protruding portion 827. The hole 827a is opened towards the hole 817a of the protruding portion 817. The hole 827a is in communication with the hole 817a of the protruding portion 817.

Referring to FIG. 11, screws 62 are inserted in the holes 817a, 827a. Therefore, the first member 81 is fixed relative to the second member 82. In view of the above, the support member 1 (the heat dissipation component 13) abuts on the protruding portion 817 of the first member 81. A force is applied from the protruding portion 817 to the support member 1 towards the second member 82. In this case, the support member 1 (the heat dissipation component 13) abuts on the semi-cylinder portion 823 of the second member. A force is applied from the semi-cylinder portion 823 to the support member 1 towards the first member 81. Thereby, the force from the protruding portion 817 towards the second member 82 is applied on the support member 1, and the force from the semi-cylinder portion 823 towards the first member 81 is applied on the support member 1, which means that the support member 1 is clamped by the protruding portion 817 and the semi-cylinder portion 823.

A method for manufacturing the LED lamp 101 is briefly illustrated with reference to FIG. 19 and FIG. 20.

Figure 19:
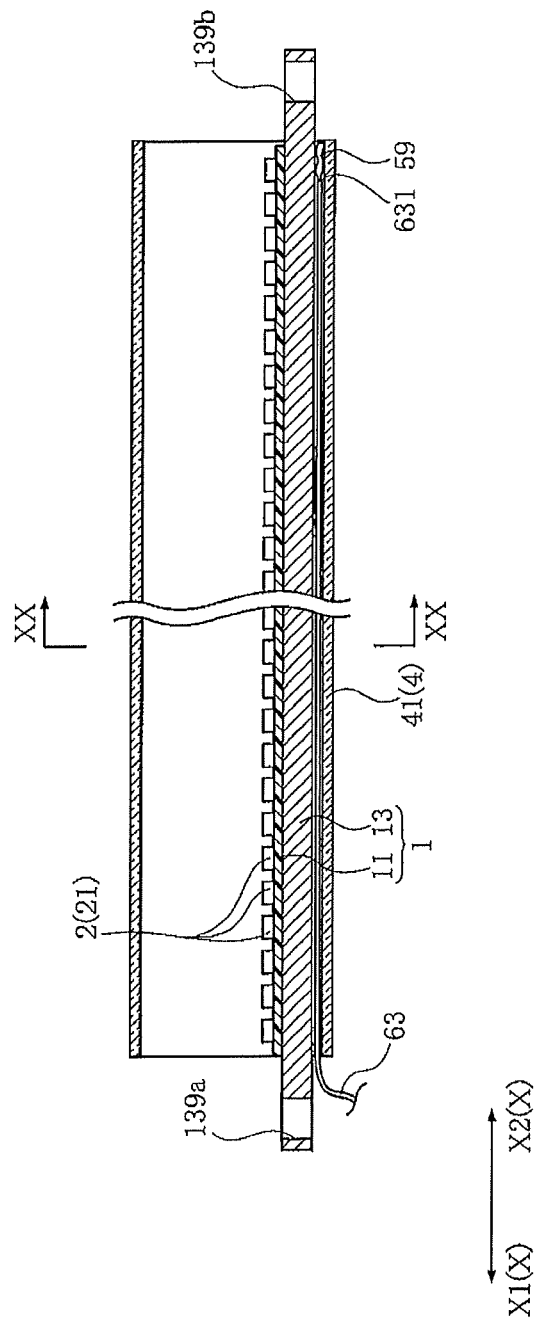
FIG. 19 is a cross-sectional view of one step in a method for manufacturing the LED lamp according to the first embodiment of the invention.
Figure 20:
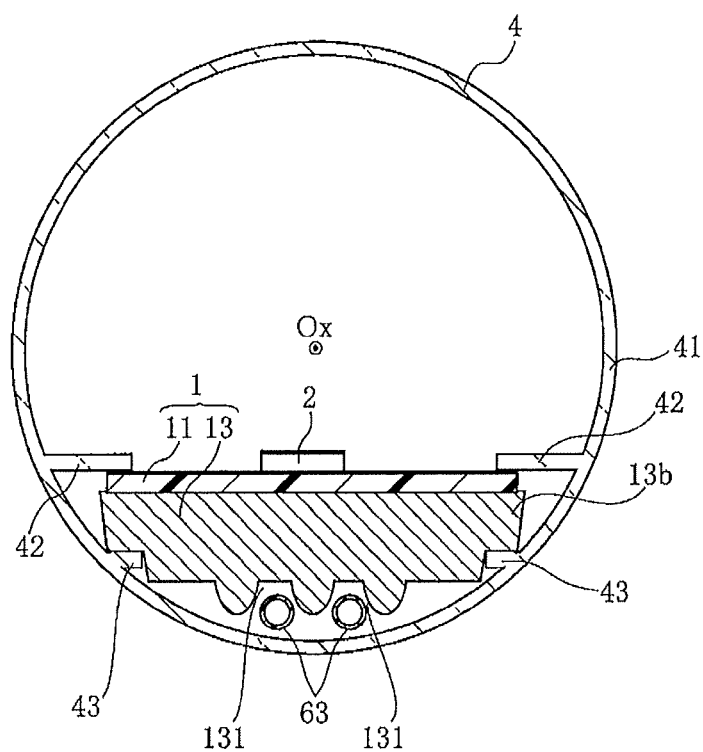
FIG. 20 is a cross-sectional view along Line XX-XX in FIG. 19.

Firstly, referring to FIG. 19, the LED modules 2 including the LED chips 21 are disposed on the substrate 11. The substrate 11 and the LED modules 2 are disposed on the heat dissipation component 13. The LED modules 2, the substrate 11, and the heat dissipation component 13 are accommodated in the tube 4. The heat dissipation component 13 and the tube 4 are adhered. The adhesion of the heat dissipation component 13 and the tube 4 are implemented by enabling an opening 631 of at least one nozzle 63 to move between the heat dissipation component 13 and the tube 4 along the direction X towards the left side of FIG. 19 and spraying an adhesive agent 59. Referring to FIG. 20, in this embodiment, the opening 631 is enabled to move by embedding each nozzle 63 in any of the grooves 131 formed on the heat dissipation component 13. After the adhesion of the heat dissipation component 13 and the tube 4, the caps 7, 8 are mounted on the tube 4. Thereby, the LED lamp 101 is manufactured.

When the LED lamp 101 is used, the current flows in the LED chip 21 through the circuit part 31. If the current flows in the LED chip 21, the LED chip 21 emits light. The light emitted from the LED chip 21 passes through the light passing space 45 in the tube 4 and reaches the tube 4 and the caps 7, 8. Then, the light is emitted from the tube 4 and the caps 7, 8. If the current flows in the LED chip 21, the LED chip 21 generates heat. The heat generated in the LED chip 21 is mainly transferred to the tube 4 through the substrate 11, the heat dissipation component 13 and the adhesive layer 5. The heat transferred to the tube 4 is dissipated to the outside of the tube 4. Thereby, the heat generated by the LED chip 21 is dissipated out of the LED lamp 101.

The beneficial effect of this embodiment is illustrated as follows.

The LED lamp 101 includes the adhesive layer 5. The adhesive layer 5 is disposed between the heat dissipation component 13 and the tube 4, and used for adhering the heat dissipation component 13 and the tube 4. With this configuration, heat can be transferred from the heat dissipation component 13 to the tube 4 through the adhesive layer 5. Generally, the thermal conductivity of the material that forms the adhesive layer 5 is greater than that of the gaseous air. Therefore, the LED lamp 101 may effectively transfer heat from the heat dissipation component 13 to the tube 4. In this manner, instead of being accumulated in the heat dissipation component 13 or the space between the heat dissipation component 13 and the tube 4, the heat generated by the LED chip 21 may effectively dissipate out of the LED lamp 101.

After the LED chip 21 is powered on for a while, the temperature of a joint portion of the adhesive layer 5 in the heat dissipation component 13 is nearly the same as the temperature of a joint portion of the adhesive layer 5 in the tube 4. That is to say, from the moment that the LED chip 21 is powered on, the convex temperature of the joint portion of the adhesive layer 5 in the heat dissipation component 13 is nearly the same as that of the joint portion of the adhesive layer 5 in the tube 4. In the LED lamp 101, the tube 4 includes a material having linear expansion coefficient greater than that of the material for forming the to heat dissipation component 13. That is to say, the linear expansion coefficient of the material that forms the tube 4 is greater than that of the material fo r forming the heat dissipation component 13. Therefore, when the LED lamp 101 is used, the heat dissipation component 13 is hard to expand in comparison with the tube 4. In this case, even if the tube 4 is supposed to expand, the tube 4 is stretched by the adhesive layer 5 connected to the heat dissipation component 13 that is hard to expand, and so that expansion is made difficult. Thereby, the expansion of the joint portion of the adhesive layer 5 in the tube 4 is suppressed.

In the LED lamp 101, the LED chips 21, the heat dissipation component 13, and the adhesive layer 5 are together surrounded by the tube 4, and accommodated in any of two spaces divided by the virtual plane 891 of the axis Ox in a space defined by the tube 4. In this configuration, since the portion 48 in FIG. 4 is connected to the adhesive layer 5 and may easily transfer a large amount of heat through the adhesive layer 5, almost no heat is transferred to the portion 49 in FIG. 4. Thereby, the temperature of the portion 48 is much higher than that of the portion 49. A great difference exists in the temperature of the portions 48, 49 at opposite sides of the axis Ox of the tube 4. In this embodiment, since the portion 48 is connected to the adhesive layer 5, the expansion of the portion 48 in the direction X is suppressed. Thereby, even if the temperature of the portion 48 is much higher than that of the portion 49, no great difference exists in the amount of expansion of the portions 48, 49 in the direction X. Therefore, thermal deformation of the tube 4 may be suppressed in the LED lamp 101.

In the LED lamp 101, the groove 131 extending along the direction X is formed on the heat dissipation component 13. The adhesive layer 5 is formed on the groove 131. When the LED lamp 101 is manufactured, as shown in FIG. 19 and FIG. 20, the groove 131 may be used as the space for disposing the nozzle 63. Thereby, the nozzle 63 is enabled to move along the groove 131, so that the opening 631 of the nozzle 63 may easily move in the direction X. Since the opening 631 moves in the direction X, the adhesive layer 5 is formed in a shape extending along the direction X.

In the LED lamp 101, the cap 7 includes the shielding wall 715 standing upright from the semi-cylinder portion 711 towards the axis Ox of the tube 4 when observed from the direction X. The shielding wall 715 faces the light passing space 45 that the light emitted from the LED chip 21 passes through. With this configuration, when the LED lamp 101 is used, the light passing through the light passing space 45 is dissipated from a portion of the cap 7 located in the direction X2 relative to the shielding wall 715. Therefore, when the LED lamp 101 is used, the portion of the cap 7 located in the direction X2 relative to the shielding wall 715 is bright. Further, the light passing through the light passing space 45 is blocked by the shielding wall 715 before reaching a portion of the cap 7 located in the direction X1 relative to the shielding wall 715. Therefore, when the LED lamp 101 is used, almost no light is emitted from the portion of the cap 7 located in the direction X1 relative to the shielding wall 715, and the portion is dark. That is to say, when the LED lamp 101 is used, the portion of the cap 7 located in the direction X2 relative to the shielding wall 715 is bright, and the portion located in the direction X1 relative to the shielding wall 715 is dark. In view of the above, the borders of the bright portion and the dark portion of the cap 7 when the LED lamp 101 is used are distinguished, thereby preventing user discomfort when the LED lamp 101 is used to replace the conventional straight-tube type fluorescent lamp.

In the LED lamp 101, the cap 7 includes the protruding portion 717 connected to the semi-cylinder portion 713 and protruded from the semi-cylinder portion 713 towards the support member 1. The support member 1 is clamped by the protruding portion 717 and the semi-cylinder portion 723. With this configuration, the support member 1 is prevented from being offset in upward and downward directions relative to the cap 7 in FIG. 5.

In the LED lamp 101, the cap 7 includes the protruding portion 727 connected to the semi-cylinder portion 723 and protruded from the semi-cylinder portion 723 towards the support member 1. The hole 717a opened towards the through hole 139a is formed on the protruding portion 717. The hole 727a opened towards the hole 717a is formed on the protruding portion 727. In this configuration, the hole 717a and the hole 727a are screw holes for inserting the screws 61. If the screws 61 are inserted in the hole 717a and the hole 727a, the protruding portion 717 formed with the hole 717a is fixed relative to the protruding portion 727 formed with the hole 727a. In this manner, the protruding portion 717 is fixed relative to the semi-cylinder portion 723 connected to the protruding portion 727. The protruding portion 717 and the semi-cylinder portion 723 can fixedly clamp the support member 1. Therefore, the support member 1 is prevented from being offset in upward and downward directions relative to the cap 7 in FIG. 5.

In the LED lamp 101, the protruding portion 727 is embedded in the through hole 139a. In this configuration, the protruding portion 727 serves as a positioning member for defining the position of the support member 1 in the cap 7.

In the LED lamp 101, the cap 7 includes the abutting portion 718a abutting on the support member 1. The abutting portion 718a is spaced apart from the protruding portion 717 in a direction from the shielding wall 715 towards any of the LED chips 21 in the direction X. In this configuration, the right-end portion of the support member 1 in FIG. 3 is prevented from inclining toward the upper side of this figure.

The cap 7 includes the shielding wall 726 overlapping with the end portions 713a and the end portions 723a on the peripheral direction of the tube 4. A thickness of any of the semi-cylinder portions 713, 723 is greater than that of any of the semi-cylinder portions 711, 721. The shielding wall 726 overlaps with any of the semi-cylinder portions 713, 723 in a diameter direction of the tube. In this configuration, the light emitted from the LED chip 21 is blocked by the shielding wall 726 before reaching the gaps between the end portions 713a and the end portions 723a. Therefore, light is prevented from being emitted out of the cap 7 from the gaps between the end portions 713a and the end portions 723a.

The cap 8 has the same advantages as the cap 7.

FIGS. 21-31 show other embodiments of the invention. In FIGS. 21-31, elements identical or similar to those in the foregoing embodiment are marked by the same symbols.

<Second Embodiment>

A second embodiment of the invention is described with reference to FIG. 21 and FIG. 22.

Figure 21:
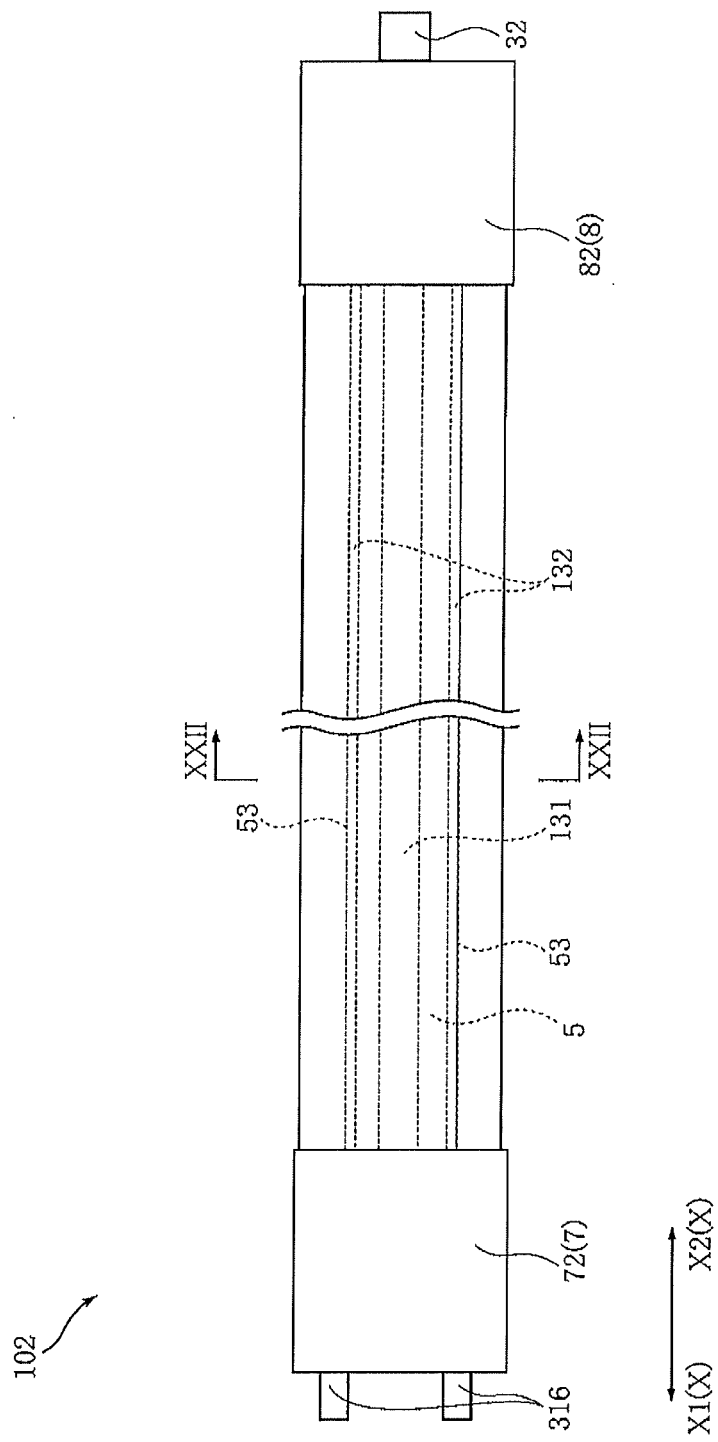
FIG. 21 is a bottom view of an LED lamp according to a second embodiment of the invention.

FIG. 21 is a bottom view of the LED lamp in this embodiment. FIG. 22 is a cross-sectional view along Line XXII-XXII in FIG. 21.

Figure 22:
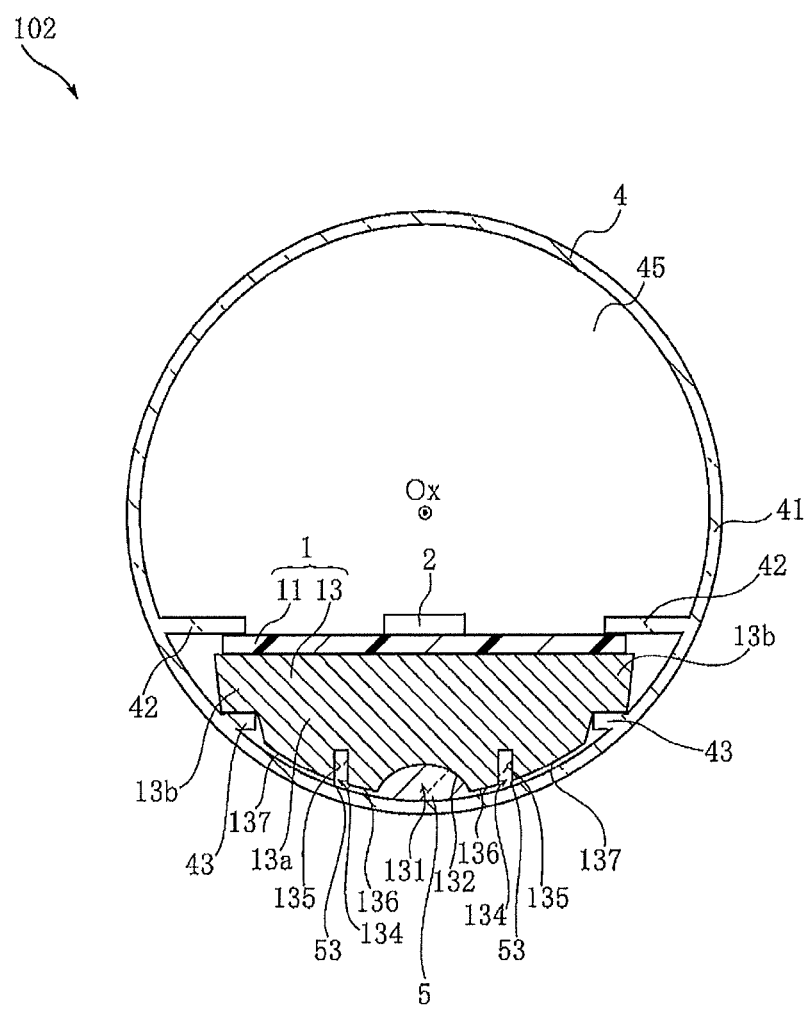
FIG. 22 is a cross-sectional view along Line XXII-XXII in FIG. 21.

The LED lamp 102 in FIG. 21 and FIG. 22 includes the support member 1, the LED modules 2, the circuit part 31, the ground terminal 32, the tube 4, the adhesive layer 5 and the caps 7, 8. In the LED lamp 102, except for the support member 1, the configurations of the LED module 2, the circuit part 31, the ground terminal 32, the tube 4, the adhesive layer 5, and the caps 7, 8 are the same as those in the LED lamp 101 and are thus omitted.

The support member 1 includes the substrate 11, the wiring pattern (not shown in the drawings) and the heat dissipation component 13. The configurations of the substrate 11 and the wiring pattern are the same as those in the forgoing embodiment and are thus omitted. The heat dissipation component 13 includes outer surfaces 136, 137. The groove 131 and two grooves 134 are formed on the heat dissipation component 13.

Each outer surface 136 serves as a first outer surface extending along the peripheral direction and the axial direction (the direction X) of the tube 4. The grooves 131, 134 are recessed from the outer surface 136. Each outer surface 137 serves as a second outer surface extending along the peripheral and the axial direction (the direction X) of the tube 4. Each outer surface 137 is connected to any of the grooves 134. The groove 134 is located between the outer surface 137 and the outer surface 136. That is to say, each outer surface 137 is located on an opposite side of the outer surface 136 relative to any of the grooves 134.

The groove 131 serves as a first groove extending along the direction X. In this embodiment, the groove 131 is formed by crossing from one end to the other end of the heat dissipation component 13 in the direction X. The groove 131 is defined by the groove surface 132. Each groove 134 serves as a second groove extending along the direction X. The groove 131 is located between the grooves 134 on the peripheral direction of the tube 4. The groove 131 is spaced apart from each groove 134 on the peripheral direction of the tube 4. In this embodiment, each groove 134 is formed by crossing from one end to the other end of the heat dissipation component 13 in the direction X. The size of the groove 134 on the peripheral direction of the tube 4 is smaller than that of the groove 131 on the peripheral direction of the tube 4. Each groove 134 is defined by the groove surface 135.

The adhesive layer 5 is formed on the grooves 131, 134 and the outer surfaces 136. That is to say, the groove surfaces 132, 135 and the outer surfaces 136 are directly connected to the adhesive layer 5. No adhesive layer 5 is formed on the outer surfaces 137. The outer surfaces 137 are entirely exposed from the adhesive layer 5. The end edges 53 of the adhesive layer 5 overlap with the grooves 134 on the peripheral direction of the tube 4.

In the LED lamp 102, the heat dissipation component 13 includes the outer surfaces 136 extending along the peripheral direction and the axial direction of the tube 4. The adhesive layer 5 is connected to the outer surfaces 136, and the groove 131 is recessed from the outer surfaces 136. In this configuration, the area in the heat dissipation component 13 adjacent to the inner surface of the tube 4 is enlarged, which facilitates heat transfer from the heat dissipation component 13 to the tube 4.

In the LED lamp 102, the grooves 134 recessed from the outer surfaces 136 and extending along the direction X are formed. The groove 131 is spaced apart from the grooves 134 on the peripheral direction of the tube 4. The adhesive layer 5 is formed on the grooves 134. In this configuration, the adhesive layer 5 of the LED lamp 102 is formed by coating the adhesive agent 59 on the outer surfaces 136 and the groove 131. After the adhesive agent 59 is coated on the outer surfaces 136 and the groove 131, the adhesive agent 59 is filled in the grooves 134. Consequently, the adhesive layer 5 covers the entire outer surfaces 136, but does not easily adhere to the outer surfaces 137. The end edges 53 of the adhesive layer 5 stand upright along the direction X. Some part of the adhesive layer 5 may be viewed from the external side of the tube 4. In this case, the straight end edges 53 may improve the appearance of the LED lamp.

<Third embodiment>

A third embodiment of the invention is described with reference to FIG. 23.

Figure 23:
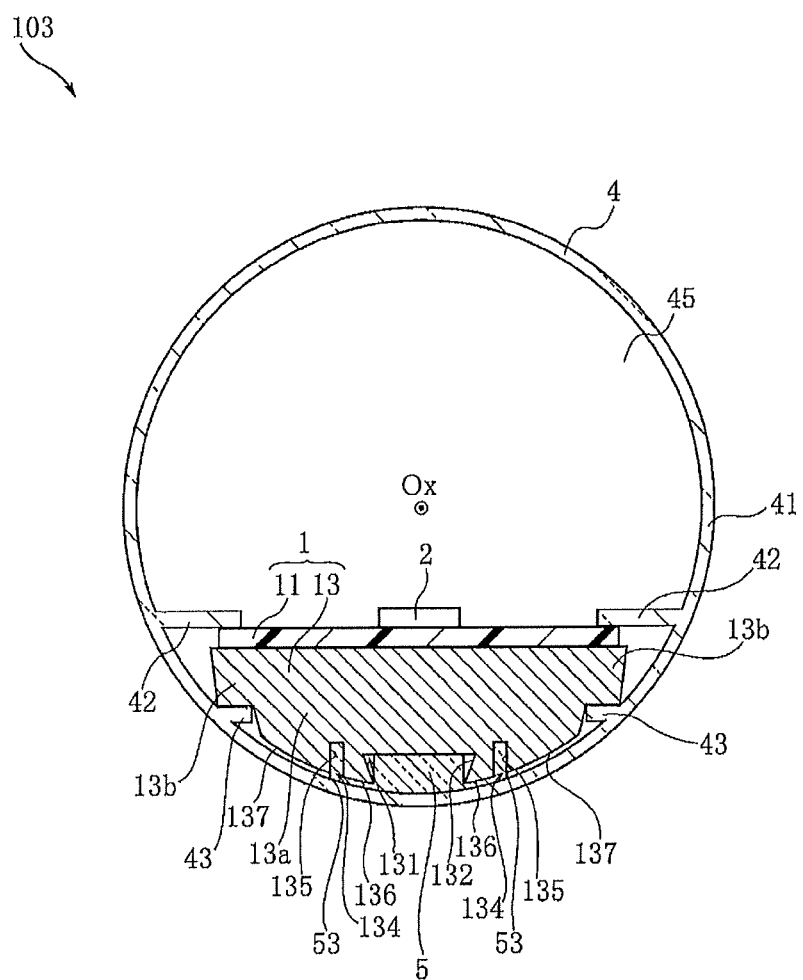
FIG. 23 is a cross-sectional view of an LED lamp according to a third embodiment of the invention.

FIG. 23 is a cross-sectional view of the LED lamp in this embodiment.

In the LED lamp 103, the cross-section of the groove 131 is different from that in the LED lamp 102. In the LED lamp 103, the groove surface 132 includes a portion spaced apart from the adhesive layer 5 with an interval. With this configuration, the heat dissipation component 13 becomes lighter.

<Fourth Embodiment>

A fourth embodiment of the invention is described with reference to FIG. 24 and FIG. 25.

Figure 24:
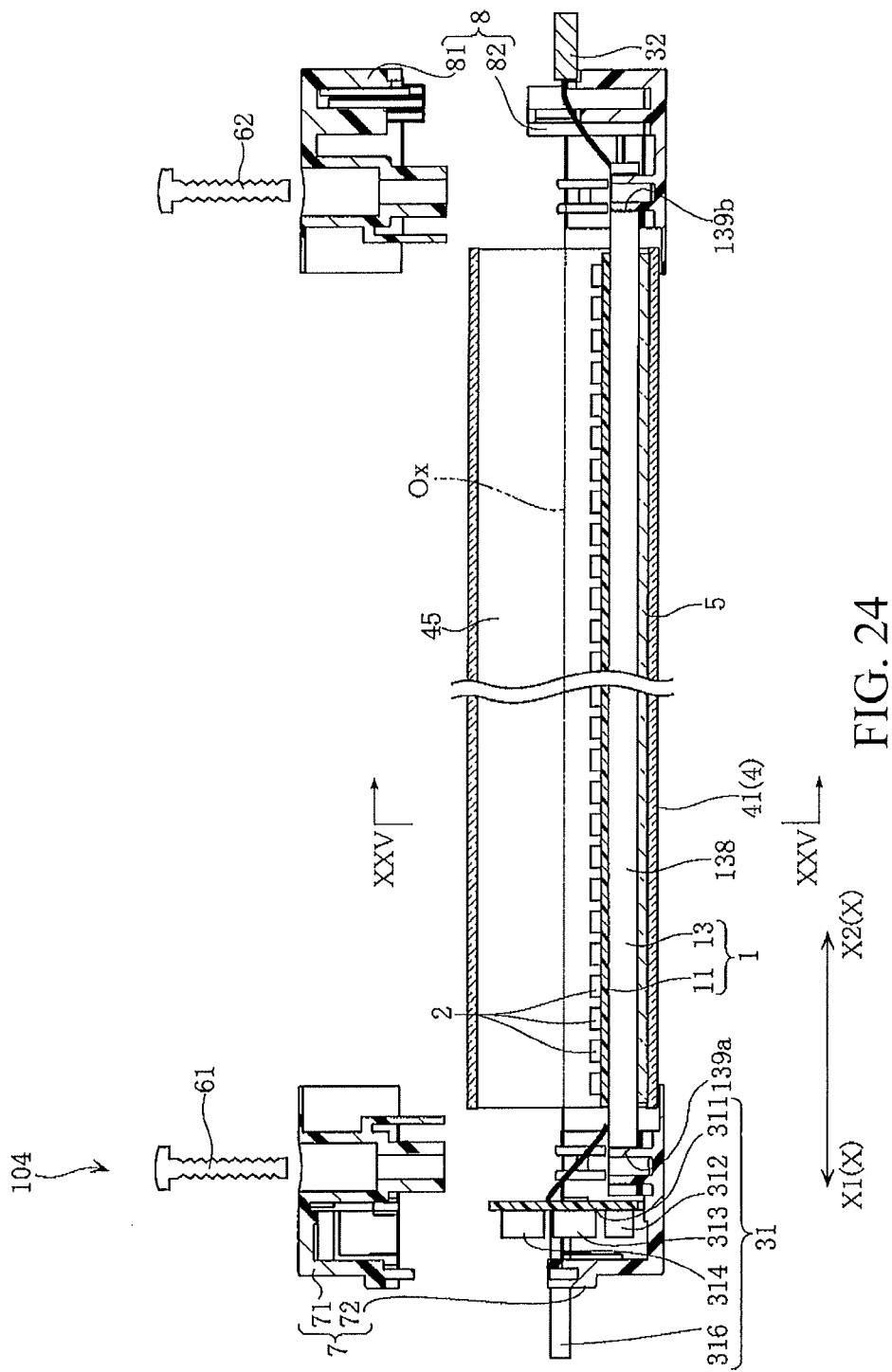
FIG. 24 is a cross-sectional exploded view of an LED lamp according to a fourth embodiment of the invention.

FIG. 24 is a cross-sectional exploded view of the LED lamp in this embodiment. FIG. 25 is a cross-sectional view along Line XXV-XXV in FIG. 24.

Figure 25:
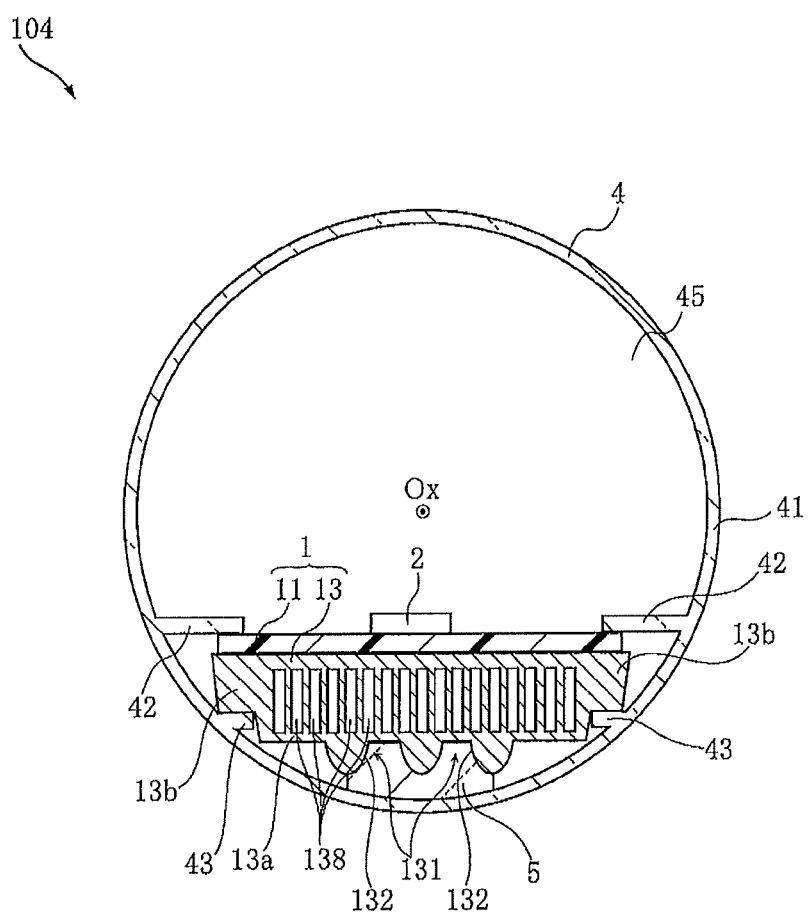
FIG. 25 is a cross-sectional view along Line XXV-XXV in FIG. 24.

Referring to FIG. 24 and FIG. 25, unlike the LED lamp 101, in the LED lamp 104, a plurality of hollow portions 138 are formed in the heat dissipation component 13. Each hollow portion 138 extends along the direction X. In this embodiment, each hollow portion 138 is opened in the direction X1 and the direction X2. The cross-section of a surface of the hollow portion 138 orthogonal to the axis Ox is rectangular. Each hollow portion 138 is in a shape extending from the axis Ox towards the adhesive layer 5 when observed from the direction X. The hollow portions 138 are arranged in a direction orthogonal to the direction from the axis Ox towards the adhesive layer 5 and the direction X. The size of the heat dissipation component 13 in the direction from the axis Ox towards the adhesive layer 5 is smaller than the size of the heat dissipation component 13 in the direction orthogonal to the direction from the axis Ox towards the adhesive layer 5 and the direction X.

The hollow portions 138 are formed in the heat dissipation component 13 of the LED lamp 104, so that the heat dissipation component 13 becomes lighter.

In the LED lamp 104, each hollow portion 138 is in a shape extending in the direction from the axis Ox towards the adhesive layer 5 when observed from the direction X. In this configuration, heat generated by the LED chip 21 can be transferred to the adhesive layer 5 without being accumulated in the hollow portion 138. Therefore, the heat generated by the LED chip 21 can be effectively transferred to the adhesive layer 5. The heat generated by the LED chip 21 can be effectively dissipated out of the LED lamp 104.

In this embodiment, an example is shown wherein the hollow portions 138 are formed in the heat dissipation component 13 of the LED lamp 101; but the hollow portions 138 may also be formed in the heat dissipation component 13 of the LED lamps 102, 103.

<Fifth Embodiment>

A fifth embodiment of the invention is described with reference to FIG. 26 and FIG. 27.

Figure 26:
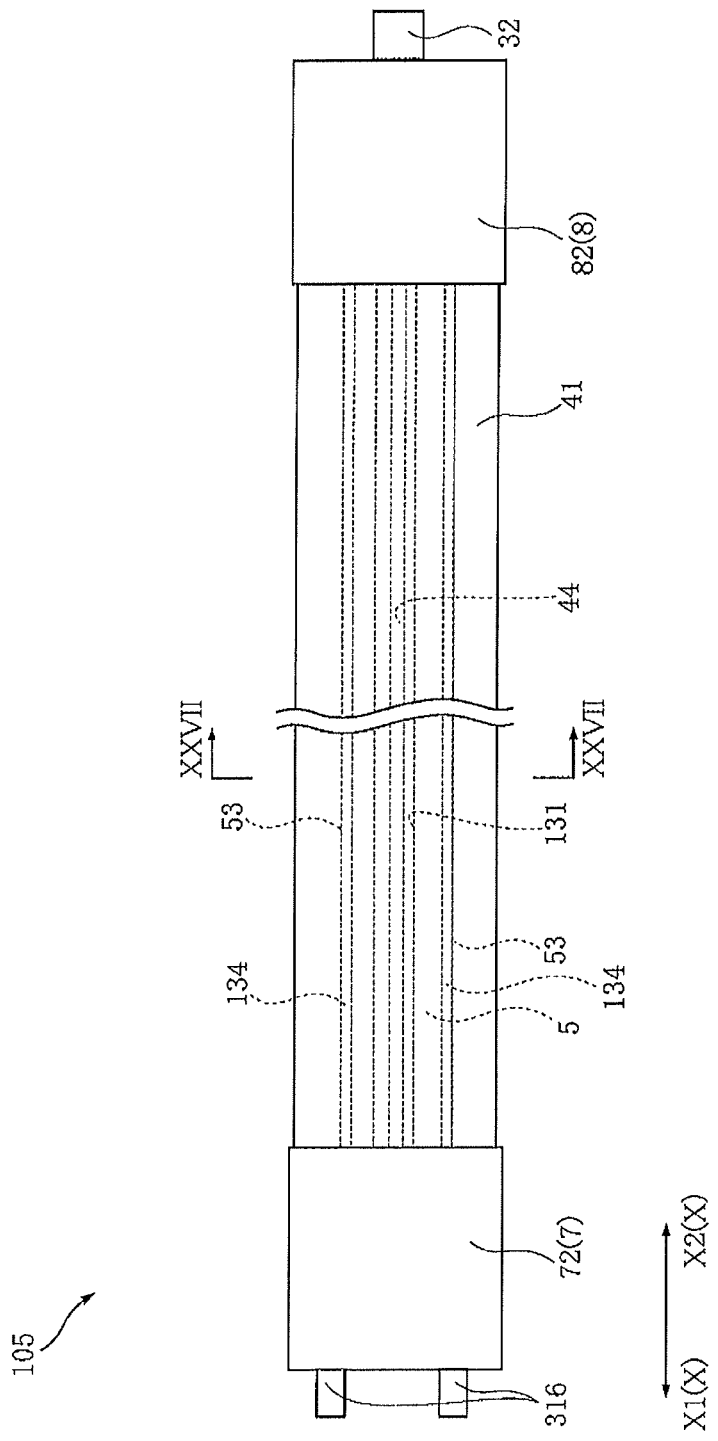
FIG. 26 is a bottom view of an LED lamp according to a fifth embodiment of the invention.

FIG. 26 is a bottom view of the LED lamp in this embodiment. FIG. 27 is a cross-sectional view along Line XXVII-XXVII in FIG. 26.

Figure 27:
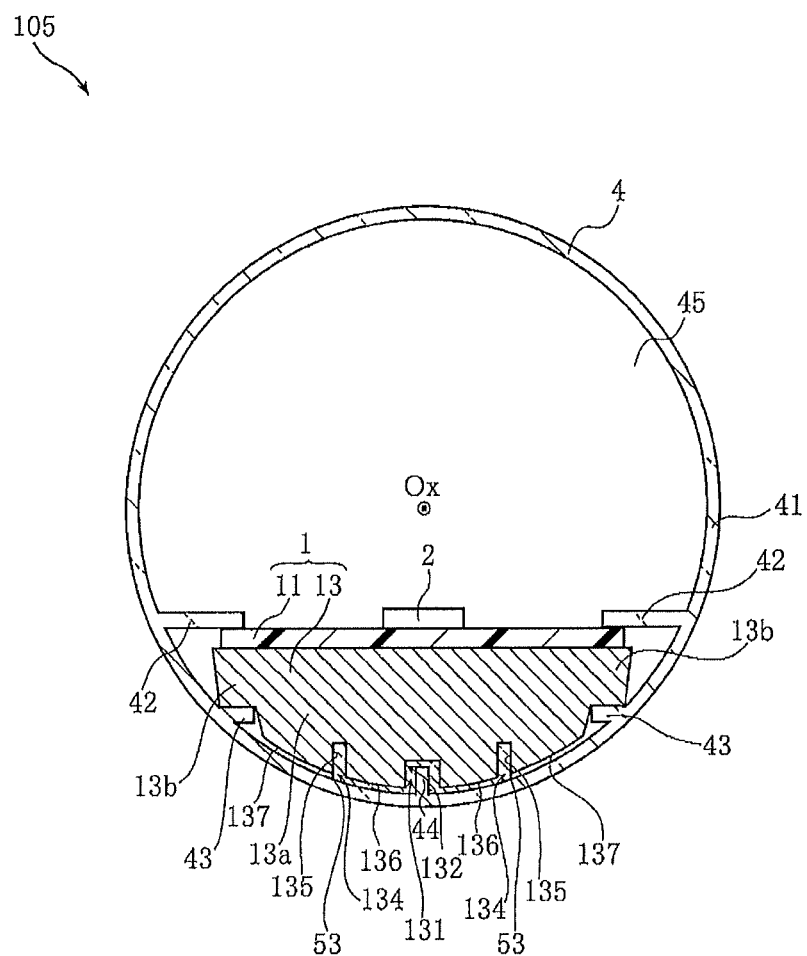
FIG. 27 is a cross-sectional view along Line XXVII-XXVII in FIG. 26.

Referring to FIG. 26 and FIG. 27, unlike the LED lamp 102, in the LED lamp 105, the tube 4 includes a protruding portion 44. The protruding portion 44 protrudes from the outer-cylinder portion 41 towards the axis Ox. The protruding portion 44 is in a shape extending along the direction X. The protruding portion 44 is embedded in the groove 131. The adhesive layer 5 is inserted between the protruding portion 44 and the groove 131 (or the groove surface 132).

This configuration enlarges the joint area between the tube 4 and the adhesive layer 5. Enlarging the joint area between the tube 4 and the adhesive layer 5 is large enhances the adhesive force between the tube 4 and the adhesive layer 5. Therefore, even if the tube 4 expands, the adhesive layer 5 may be less easily peeled off from the tube 4, thereby improving the reliability of the LED lamp 105.

<Sixth Embodiment>

A sixth embodiment of the invention is described with reference to FIG. 28.

Figure 28:
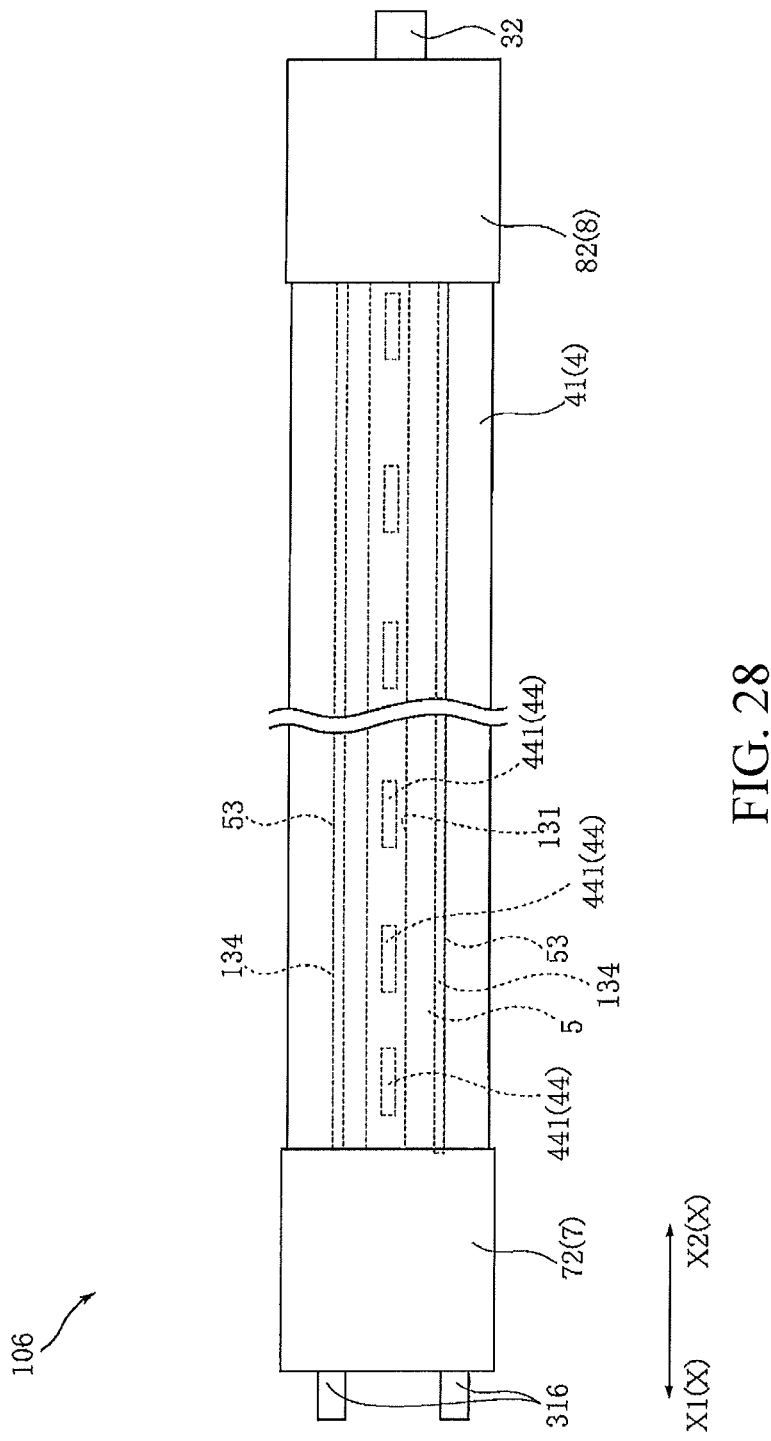
FIG. 28 is a bottom view of an LED lamp according to a sixth embodiment of the invention.

FIG. 28 is a bottom view of the LED lamp in this embodiment.

Referring to FIG. 28, unlike the LED lamp 105, in the LED lamp 106, the protruding portion 44 includes a plurality of strip slices 441. The strip slices 441 are disposed at intervals along the direction X.

In this configuration, a thickness of the part of the groove 131 in the adhesive layer 5 without the strip slices 441 (the size thereof in the diameter direction of the tube 4) is increased. Therefore, even if the tube 4 expands and the adhesive layer 5 is stretched by the heat dissipation component 13 and the tube 4, the adhesive layer 5 is more resistant to becoming torn off, thereby increasing the reliability of the LED lamp 106.

<Seventh Embodiment>

Figure 30:
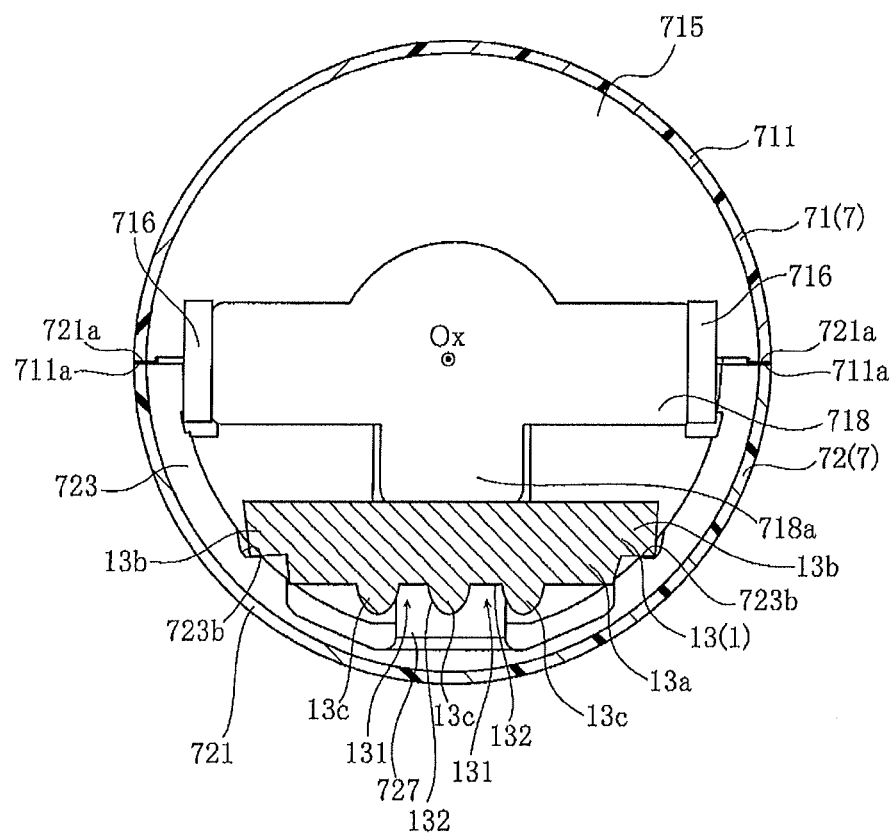
FIG. 30 is a cross-sectional view of the LED lamp according to the seventh embodiment of the invention.
Figure 31:
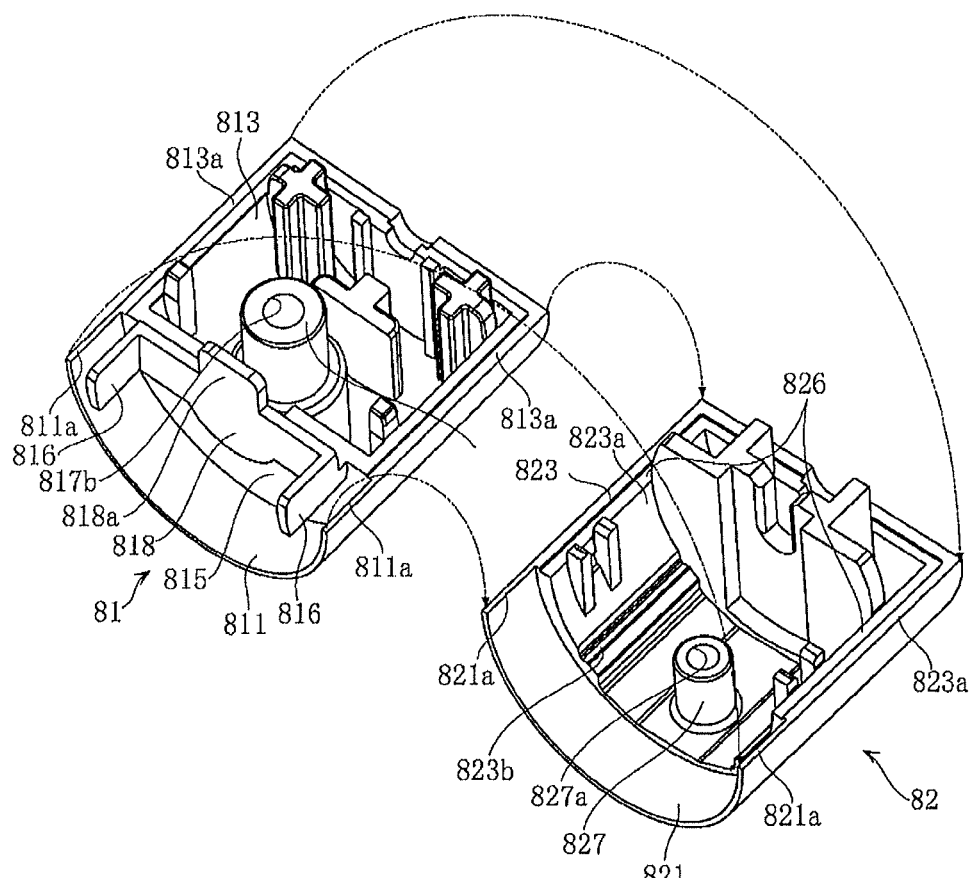
FIG. 31 is a three-dimensional exploded view of the cap of the LED lamp according to the seventh embodiment of the invention.
Figure 32:
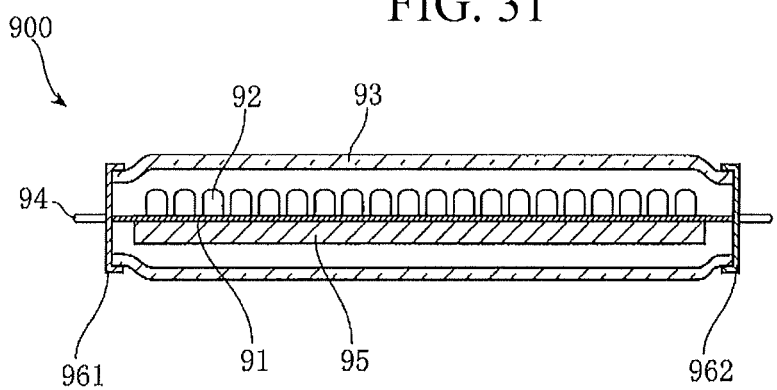
FIG. 32 is a cross-sectional view of an example of a conventional LED lamp.

A seventh embodiment of the invention is described with reference to FIGS. 29-31.

Figure 29:
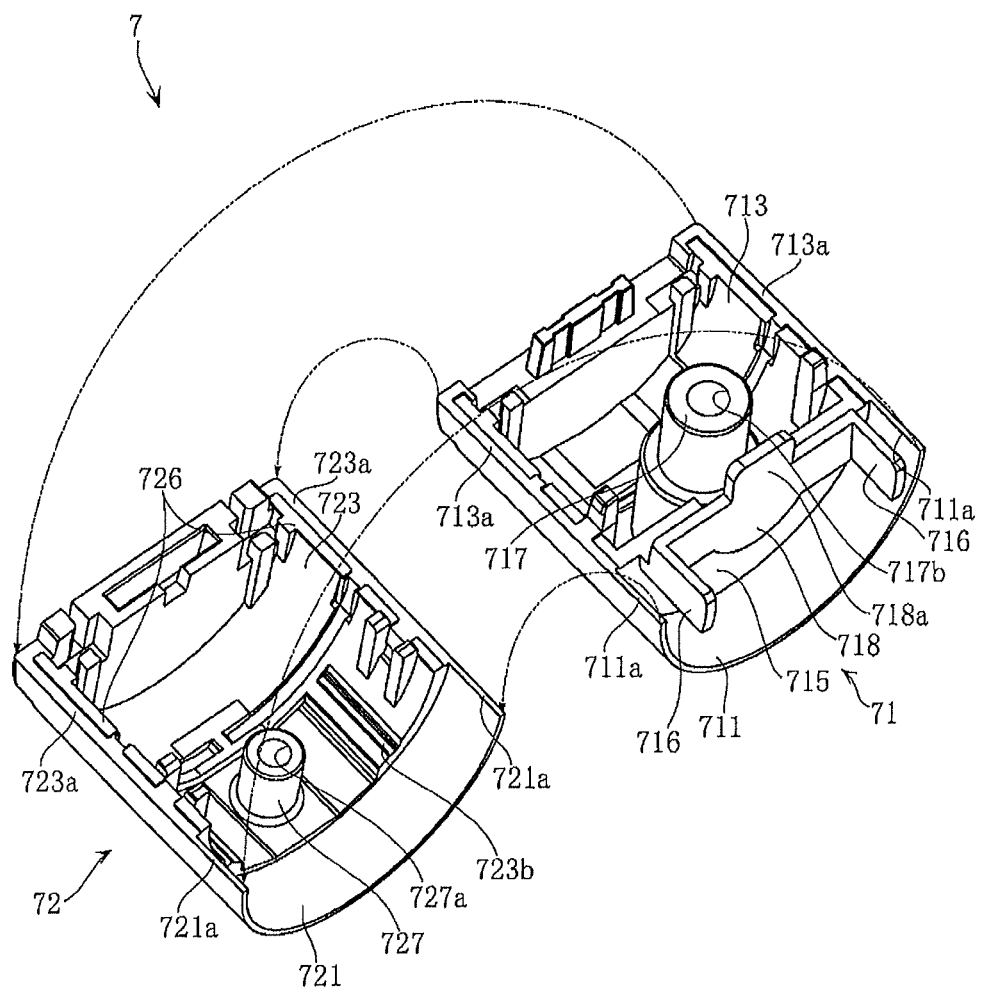
FIG. 29 is a three-dimensional exploded view of a cap of an LED lamp according to a seventh embodiment of the invention.

FIG. 29 is a three-dimensional exploded view of the cap 7 of the LED lamp in this embodiment. FIG. 30 is a cross-sectional view of the LED lamp in this embodiment. FIG. 31 is a three-dimensional exploded view of the cap 8 of the LED lamp in this embodiment. FIG. 30 corresponds to FIG. 7.

In the LED lamp of this embodiment, unlike the LED lamp 101, the first member 71 of the cap 7 includes a shielding wall 716 (the second shielding wall), and the first member 81 of the cap 8 includes a shielding wall 816 (the second shielding wall).

The shielding walls 716, 816 face the light passing space 45 formed in the tube 4. The shielding wall 716 overlaps with the end portions 711a and the end portions 721a on the peripheral direction of the tube 4. In this embodiment, the shielding wall 716 is connected to the support wall 718. Alternatively, unlike this embodiment, the shielding wall 716 is not connected to the support wall 718, but connected to the shielding wall 715.

In this configuration, the light emitted from the LED chip 21 is blocked by the shielding wall 716 before reaching the gaps between the end portions 711a and the end portions 721a. Therefore, light is prevented from being emitted out of the cap 7 from the gaps between the end portions 711a and the end portions 721a. Similarly, light is prevented from being emitted out of the cap 8 from the gaps between the end portions 811a and the end portions 821a.

The invention is not limited to the above embodiments. The specific configurations of the parts in the invention may be changed freely according to design requirements.

While several embodiments of the present invention have been illustrated and described, various modifications and improvements can be made by those skilled in the art. The embodiments of the present invention are therefore described in an illustrative but not in a restrictive sense. It is intended that the present invention should not be limited to the particular forms as illustrated and that all modifications which maintain the spirit and scope of the present invention are within the scope defined in the appended claims.

What is claimed is:

1. A LED lamp, comprising:
a tube;
a support member, comprising a heat dissipation component extending in an axial direction of the tube and accommodated in the tube;
a plurality of LED chips, accommodated in the tube and supported by the support member; and
an adhesive layer, disposed between the heat dissipation component and the tube, and used for adhering the heat dissipation component and the tube;
wherein the tube comprises a material having a linear expansion coefficient greater than that of the material for forming the heat dissipation component.

2. The LED lamp according to claim 1, wherein the LED chips, the heat dissipation component, and the adhesive layer are entirely accommodated in any of two spaces divided by a virtual plane of an axis of the tube in a space surrounded and defined by the tube.

3. The LED lamp according to claim 1, wherein the adhesive layer is in a shape extending along the axial direction.

4. The LED lamp according to claim 1, wherein the heat dissipation component has a first groove formed thereon and extending along the axial direction; and the adhesive layer is formed on the first groove.

5. The LED lamp according to claim 4, wherein the heat dissipation component comprises a first outer surface along a peripheral direction and the axial direction of the tube; and the adhesive layer has contact with the first outer surface, and the first groove is recessed from the first outer surface.

6. The LED lamp according to claim 5, wherein the heat dissipation component has a second groove formed thereon, which is recessed from the first outer surface and extends along the axial direction, the first groove is spaced apart from the second groove on the peripheral direction of the tube, and the adhesive layer is formed on the second groove.

7. The LED lamp according to claim 6, wherein the heat dissipation component comprises a second outer surface connected to the second groove, and the second outer surface is located on an opposite side of the first outer surface relative to the second groove and is entirely exposed from the adhesive layer.

8. The LED lamp according to claim 4, wherein the heat dissipation component comprises a groove surface that defines the first groove; and the groove surface comprises a portion spaced apart from the adhesive layer with an interval.

9. The LED lamp according to claim 1, wherein the heat dissipation component has a hollow portion formed thereon and extending in the axial direction.

10. The LED lamp according to claim 9, wherein the hollow portion has an opening formed in the axial direction.

11. The LED lamp according to claim 9, wherein a cross-section of a surface of the hollow portion orthogonal to the axial direction is rectangular, and when observed from the axial direction, the hollow portion is in a shape extending from an axis of the tube towards the adhesive layer.

12. A LED lamp, comprising:
a tube:
a support member, comprising a heat dissipation component extending in an axial direction of the tube and accommodated in the tube;
a plurality of LED chips, accommodated in the tube and supported by the support member; and
an adhesive layer, disposed between the heat dissipation component and the tube, and used for adhering the heat dissipation component and the tube,
wherein the adhesive layer comprises a resin portion and a filler mixed into the resin portion, and the filler comprises a material having a thermal conductivity greater than that of the material for forming the resin portion.

13. The LED lamp according to claim 12, wherein the resin portion comprises silicone based materials.

14. The LED lamp according to claim 4, wherein the tube comprises an outer-cylinder portion having a circular cross-section and a protruding portion protruded from the outer-cylinder portion; and the protruding portion is embedded in the first groove, and the adhesive layer is disposed between the protruding portion and the first groove.

15. The LED lamp according to claim 14, wherein the protruding portion comprises a plurality of strip slices disposed at intervals along the axial direction.

16. A LED lamp, comprising:
a tube;
a support member, comprising a heat dissipation component extending in an axial direction of the tube and accommodated in the tube;
a plurality of LED chips, accommodated in the tube and supported by the support member;

an adhesive layer, disposed between the heat dissipation component and the tube, and used for adhering the heat dissipation component and the tube; and a cap having a first semi-cylinder portion and a second semi-cylinder portion, wherein the tube has a light passing space formed thereon and allowing light emitted from each LED chip to pass through;

the first semi-cylinder portion and the second semi-cylinder portion together surround the tube;

the cap comprises a first shielding wall standing upright from the first semi-cylinder portion towards an axis of the tube when observed from the axial direction of the tube; and the first shielding wall faces the light passing space and overlaps with the support member in the axial direction.

17. The LED lamp according to claim 16, wherein the first semi-cylinder portion comprises a first end portion located at one end on a peripheral direction of the tube, the second semi-cylinder portion comprises a second end portion located at one end on the peripheral direction, and the first end portion and the second end portion face each other.

18. The LED lamp according to claim 17, wherein the cap comprises a second shielding wall facing the light passing space and overlapping with the first end portion and the second end portion on the peripheral direction.

19. The LED lamp according to claim 16, wherein the cap comprises a third semi-cylinder portion connected to the first semi-cylinder portion and a fourth semi-cylinder portion connected to the second semi-cylinder portion; and the third semi-cylinder portion comprises a third end portion located at one end on the peripheral direction, the fourth semi-cylinder portion comprises a fourth end portion located at one end on the peripheral direction, and the third end portion and the fourth end portion face each other.

20. The LED lamp according to claim 19, wherein the cap comprises a first protruding portion connected to the third semi-cylinder portion and protruded from the third semi-cylinder portion towards the support member; and the support member is clamped by the first protruding portion and the fourth semi-cylinder portion.

21. The LED lamp according to claim 20, wherein the cap comprises a second protruding portion connected to the fourth semi-cylinder portion and protruded from the fourth semi-cylinder portion towards the support member; and a through hole is formed on the support member, the first protruding portion has a first hole formed thereon and opened towards the through hole, and the second protruding portion has a second hole formed thereon and opened towards the first hole.

22. The LED lamp according to claim 21, wherein the second protruding portion is embedded in the through hole.

23. The LED lamp according to claim 20, wherein the cap comprises an abutting portion abutting on the support member, and the abutting portion is spaced apart from the first protruding portion in a direction from the first shielding wall towards any of the LED chips along the axial direction of the tube.

24. The LED lamp according to claim 19, wherein the cap comprises a third shielding wall overlapping with the third end portion and the fourth end portion on the peripheral direction; and a thickness of the third semi-cylinder portion and a thickness of the fourth semi-cylinder portion are both greater than any of the first semi-cylinder portion and the second semi-cylinder portion, and the third shielding wall overlaps with any of the third semi-cylinder portion and the fourth semi-cylinder portion in a diameter direction of the tube.

25. The LED lamp according to claim 19, wherein a thickness of the third semi-cylinder portion and a thickness of the fourth semi-cylinder portion are both greater than any of the first semi-cylinder portion and the second semi-cylinder portion, and the fourth semi-cylinder portion has a notch formed thereon and the support member is embedded in the notch.

26. The LED lamp according to claim 16, further comprising a circuit part accommodated in the cap; and the circuit part comprises a diode bridge having two input terminals and two output terminals and a resistor electrically disposed between the input terminals, and the LED chips are electrically disposed between the output terminals.

27. The LED lamp according to claim 26, wherein the circuit part comprises an alternating current/direct current (AC/DC) converter for converting an input commercial AC voltage into a DC voltage.

28. A LED lamp, comprising:
a plurality of LED chips;
a support member, for supporting the LED chips;
a tube, for accommodating the LED chips and the support member, and having a light passing space formed thereon and allowed light emitted from each LED chip to pass through; and
a cap, comprising a first semi-cylinder portion and a second semi-cylinder portion, wherein
the first semi-cylinder portion and the second semi-cylinder portion together surround the tube;
the cap comprises a first shielding wall standing upright from the first semi-cylinder portion towards an axis of the tube when observed from an axial direction of the tube; and
the first shielding wall faces the light passing space and overlaps with the support member in the axial direction.

29. The LED lamp according to claim 28, wherein the first semi-cylinder portion comprises a first end portion located at one end on a peripheral direction of the tube, the second semi-cylinder portion comprises a second end portion located at one end on the peripheral direction, and the first end portion and the second end portion face each other.

30. The LED lamp according to claim 29, wherein the cap comprises a second shielding wall facing the light passing space and overlapping with the first end portion and the second end portion on the peripheral direction.

31. The LED lamp according to claim 28, wherein the cap comprises a third semi-cylinder portion connected to the first semi-cylinder portion and a fourth semi-cylinder portion connected to the second semi-cylinder portion; and the third semi-cylinder portion comprises a third end portion located at one end on a peripheral direction, the fourth semi-cylinder portion comprises a fourth end portion located at one end on the peripheral direction, and the third end portion and the fourth end portion face each other.

32. The LED lamp according to claim 31, wherein the cap comprises a first protruding portion connected to the third semi-cylinder portion and protruded from the third semi-cylinder portion towards the support member; and the support member is clamped by the first protruding portion and the fourth semi-cylinder portion.

33. The LED lamp according to claim 32, wherein the cap comprises a second protruding portion connected to the fourth semi-cylinder portion and protruded from the fourth semi-cylinder portion towards the support member; and a through hole is formed on the support member, the first protruding portion has a first hole formed thereon and opened towards the through hole, and the second protruding portion has a second hole formed thereon and opened towards the first hole.

34. The LED lamp according to claim 33, wherein the second protruding portion is embedded in the through hole.

35. The LED lamp according to claim 32, wherein the cap comprises an abutting portion abutting on the support member, and the abutting portion is spaced apart from the first protruding portion in a direction from the first shielding wall towards any of the LED chips along the axial direction of the tube.

36. The LED lamp according to claim 31, wherein the cap comprises a third shielding wall overlapping with the third end portion and the fourth end portion on the peripheral direction; and a thickness of the third semi-cylinder portion and a thickness of the fourth semi-cylinder portion are both greater than any of the first semi-cylinder portion and the second semi-cylinder portion, and the third shielding wall overlaps with any of the third semi-cylinder portion and the fourth semi-cylinder portion in a diameter direction of the tube.

37. The LED lamp according to claim 31, wherein a thickness of the third semi-cylinder portion and a thickness of the fourth semi-cylinder portion are both greater than any of the first semi-cylinder portion and the second semi-cylinder portion, and the fourth semi-cylinder portion has a notch formed thereon and the support member is embedded in the notch.

38. The LED lamp according to claim 28, further comprising a circuit part accommodated in the cap; and the circuit part comprises a diode bridge having two input terminals and two output terminals and a resistor electrically disposed between the input terminals, and the LED chips are electrically disposed between the output terminals.

39. The LED lamp according to claim 28, wherein the circuit part comprises an alternating current/direct current (AC/DC) converter for converting an input commercial AC voltage into a DC voltage.

40. A method for manufacturing the LED lamp of claim 1, comprising:
disposing the plurality of LED chips on the heat dissipation component;
accommodating the heat dissipation component and the LED chips in the tube; and
adhering the heat dissipation component and the tube via an adhesive agent, wherein
in the adhesion step, an opening of a nozzle moves between the heat dissipation component and the tube along an axial direction of the tube, and meanwhile the adhesive agent is discharged from the opening.

* * * * *